(12) United States Patent
Hsieh

(10) Patent No.: US 11,581,273 B2
(45) Date of Patent: Feb. 14, 2023

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventor: Meng-Wei Hsieh, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/727,723

(22) Filed: Dec. 26, 2019

(65) Prior Publication Data

US 2021/0202406 A1    Jul. 1, 2021

(51) Int. Cl.
| | |
|---|---|
| *H01L 23/66* | (2006.01) |
| *H01L 23/522* | (2006.01) |
| *H01L 23/31* | (2006.01) |
| *H01L 21/48* | (2006.01) |
| *H01L 21/56* | (2006.01) |
| *H01Q 1/38* | (2006.01) |

(52) U.S. Cl.
CPC ............ *H01L 23/66* (2013.01); *H01L 21/481* (2013.01); *H01L 21/486* (2013.01); *H01L 21/568* (2013.01); *H01L 23/3128* (2013.01); *H01L 23/5226* (2013.01); *H01L 2223/6677* (2013.01); *H01Q 1/38* (2013.01)

(58) Field of Classification Search
None
See application file for complete search history.

(56) References Cited

U.S. PATENT DOCUMENTS

| | | | | |
|---|---|---|---|---|
| 2014/0062607 A1* | 3/2014 | Nair | ..................... | H01L 23/5389 331/68 |
| 2014/0367160 A1* | 12/2014 | Yu | ....................... | H01L 23/5383 174/377 |
| 2016/0374203 A1* | 12/2016 | Bakre | ................... | H05K 1/0265 |
| 2017/0092669 A1* | 3/2017 | Jerome | ............. | H01L 27/14687 |
| 2017/0287735 A1* | 10/2017 | Yao | ........................ | H01L 21/565 |

(Continued)

FOREIGN PATENT DOCUMENTS

CN     107959109 A     4/2018

OTHER PUBLICATIONS

Engineering ToolBox, (2003). Thermal Expansion—Linear Expansion Coefficients. [online] Available at: https://www.engineeringtoolbox.com/linear-expansion-coefficients-d_95.html [Mar. 16, 2022], (Year: 2022).*

*Primary Examiner* — Jay C Chang
(74) *Attorney, Agent, or Firm* — Foley & Lardner LLP

(57) ABSTRACT

A semiconductor device package includes a first circuit layer and an emitting device. The first circuit layer has a first surface, a second surface opposite to the first surface and a lateral surface extending between the first surface and the second surface. The emitting device is disposed on the second surface of the first circuit layer. The emitting device has a first surface facing the second surface of the first circuit layer, a second surface opposite to the first surface and a lateral surface extending between the first surface and the second surface. The emitting device has a conductive pattern disposed on the second surface of the emitting device. The lateral surface of the emitting device and the lateral surface of the first circuit layer are discontinuous.

11 Claims, 30 Drawing Sheets

(56) References Cited

U.S. PATENT DOCUMENTS

| | | | | |
|---|---|---|---|---|
| 2019/0139915 A1* | 5/2019 | Dalmia | ................ | H01L 23/552 |
| 2019/0165112 A1* | 5/2019 | Kao | .................. | H01L 29/41791 |
| 2020/0028239 A1* | 1/2020 | So | ........................ | H01Q 1/2283 |
| 2020/0402931 A1* | 12/2020 | Chen | .................. | H01Q 15/0013 |

* cited by examiner

SEMICONDUCTOR DEVICE PACKAGE AND METHOD OF MANUFACTURING THE SAME

BACKGROUND

1. Technical Field

The present disclosure relates to a semiconductor device package and a method of manufacturing the same, and more particularly to a semiconductor device package including an antenna and a method of manufacturing the same.

2. Description of the Related Art

Wireless communication devices, such as cell phones, typically include antennas for transmitting and receiving radio frequency (RF) signals. Comparably, a wireless communication device includes an antenna and a communication module, each disposed on different parts of a circuit board. Under the comparable approach, the antenna and the communication module are separately manufactured and electrically connected together after being placed on the circuit board. Accordingly, separate manufacturing costs may be incurred for both components. Furthermore, it may be difficult to reduce a size of the wireless communication device to attain a suitably compact product design. To reduce the cost and package size, an Antenna-in-Package (AiP) approach is provided. In general, an organic substrate is used in an AiP system. However, due to the process constraint of the organic substrate, it is difficult to achieve fine-pitch (less than 15/15 μm), and the thickness of the organic substrate is relatively thick, which will hinder the miniaturization of the AiP system.

SUMMARY

In accordance with some embodiments of the present disclosure, a semiconductor device package includes a first circuit layer and an emitting device. The first circuit layer has a first surface, a second surface opposite to the first surface and a lateral surface extending between the first surface and the second surface. The emitting device is disposed on the second surface of the first circuit layer. The emitting device has a first surface facing the second surface of the first circuit layer, a second surface opposite to the first surface and a lateral surface extending between the first surface and the second surface. The emitting device has a conductive pattern disposed on the second surface of the emitting device. The lateral surface of the emitting device and the lateral surface of the first circuit layer are discontinuous.

In accordance with some embodiments of the present disclosure, a semiconductor device package includes a building-up circuit, an adhesive layer and an emitting device. The building-up circuit has a first surface and a second surface opposite to the first surface. The building-up circuit has a first conductive pattern and a dielectric layer covering a portion of the first conductive pattern. A lower surface of the first conductive pattern and a lower surface of the dielectric layer are coplanar with the first surface of the building-up circuit. The adhesive layer is disposed on first conductive pattern. The adhesive layer having a first surface facing away from the first conductive pattern. The emitting device is disposed on the first surface of the adhesive layer. The emitting device has a first surface facing away from the first circuit. The emitting device has a second conductive pattern disposed on the first surface of the emitting device.

In accordance with some embodiments of the present disclosure, a method of manufacturing an optical module includes (a) providing a carrier; (b) forming a first circuit layer on the carrier; (c) forming a first set of conductive pillars on a first surface of the first circuit layer; (d) removing the carrier to expose a second surface of the first circuit layer opposite to the first surface of the first circuit layer; and (e) disposing an emitting device on the second surface of the first circuit layer, the emitting device having a conductive pattern disposed on a surface of the emitting device facing away from the first circuit layer.

Figure 1:
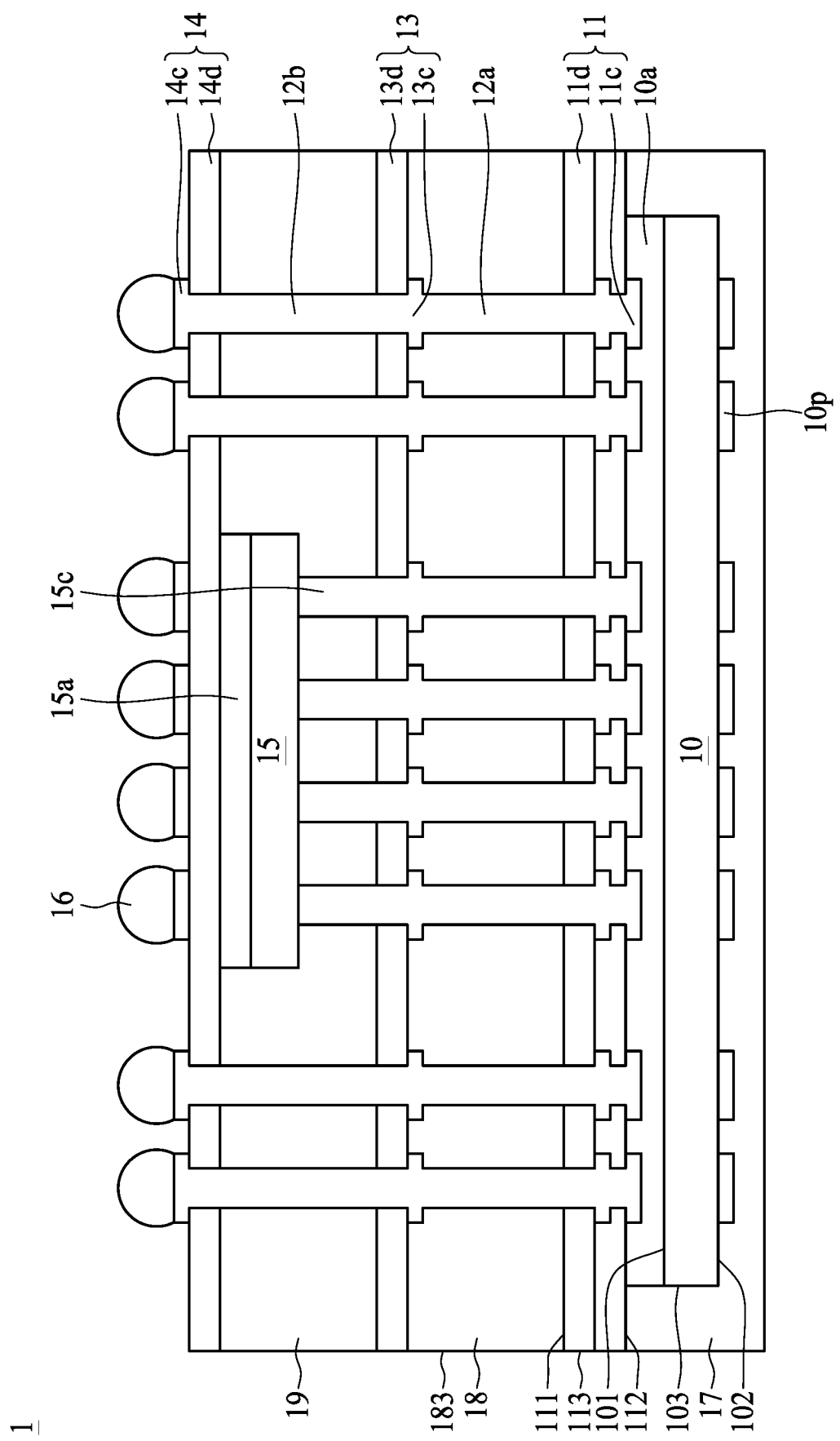
FIG. 1 illustrates a cross-sectional view of a semiconductor device package in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

FIG. 1 illustrates a cross-sectional view of a semiconductor device package 1 in accordance with some embodiments of the present disclosure. The semiconductor device package 1 includes a carrier 10, circuit layers 11, 13, 14, interconnection structures 12a, 12b, an electronic component 15, electrical contacts 16 and package bodies 17, 18 and 19.

In some embodiments, the carrier 10 may be or include a glass substrate. In some embodiments, the carrier 10 may be or include an emitting device having one or more emitting components (e.g., an antenna, a light emitting device, a sensor or the like) disposed thereon. The carrier 10 may include conductive pad(s), trace(s), and interconnection(s) (e.g. via(s)). In some embodiments, the carrier 10 may include transparent material. In some embodiments, the carrier 10 may include opaque material. The carrier 10 includes a material having a dielectric constant (Dk) less than approximately 5. The carrier 10 includes a material having a Dk less than approximately 3. The carrier 10 includes a material having a loss tangent or dissipation factor (Df) less than approximately 0.005. The carrier 10 includes a material having a loss tangent or Df less than approximately 0.003. The carrier 10 has a surface 101, a surface 102 opposite to the surface 101 and a lateral surface 103 extending between the surface 101 and the surface 102. Compared to the organic substrate, it is easier to control the thickness of a glass carrier, which can facilitate the miniaturization of the semiconductor device package 1. In some embodiments, the thickness of the carrier 10 is about 400 µm. In some embodiments, a coefficient of thermal expansion (CTE) of the carrier 10 is in a range from about 0.5 to about 13. In some embodiments, the CTE of the carrier 10 is in a range from about 3.6 to about 8.5.

A conductive layer 10p is disposed on the surface 102 of the carrier 10. In some embodiments, the conductive layer 10p defines a patterned antenna, such as a directional antenna, an omnidirectional antenna, an antenna array. For example, the conductive layer 10p defines a patch antenna. The conductive layer 10p is, or includes, a conductive material such as a metal or metal alloy. Examples of the conductive material include gold (Au), silver (Ag), copper (Cu), platinum (Pt), Palladium (Pd), other metal(s) or alloy(s), or a combination of two or more thereof. In some embodiments, the conductive layer 10p may be replaced by one or more light emitting devices or sensors.

The circuit layer 11 (or building-up circuit) has a surface 111 facing away from the carrier 10, a surface 112 opposite to the surface 111 and a lateral surface 113 extending between the surface 111 and the surface 112. The carrier 10 is disposed on the surface 112 of the circuit layer 11. The carrier 10 is connected to the surface 112 of the circuit layer 11 through an adhesive layer 10a (e.g., a die attach film, DAF). The carrier 10 is spaced apart from the circuit layer 11. For example, there is a distance (e.g., a thickness of the adhesive layer 10a) between the surface 101 of the carrier 10 and the surface 112 of the circuit layer 11. In some embodiments, the lateral surface 113 of the circuit layer 11 and the lateral surface 103 of the carrier 10 are noncoplanar or discontinuous. For example, the lateral surface 103 of the carrier 10 is recessed from the lateral surface 113 of the circuit layer 11. For example, a width of the carrier 10 is less than a width of the circuit layer 11.

The circuit layer 11 includes one or more conductive layers (e.g., redistribution layers, RDLs) 11c and one or more dielectric layers 11d. A portion of the conductive layer 11c is covered or encapsulated by the dielectric layer 11d while another portion of the conductive layer 11c is exposed from the dielectric layer 11d to provide electrical connections. In some embodiments, the exposed portion of the conductive layer 11c is embedded within the adhesive layer 10a. For example, the portion of the conductive layer 11c disposed on the surface 112 of the circuit layer 11 is disposed within the adhesive layer 10a. In some embodiments, the conductive layer 11c may be or include one or more antenna patterns, light emitting devices, sensors or the like.

In some embodiments, the dielectric layer 11d may include pre-impregnated composite fibers (e.g., pre-preg), Borophosphosilicate Glass (BPSG), silicon oxide, silicon nitride, silicon oxynitride, Undoped Silicate Glass (USG), any combination of two or more thereof, or the like. Examples of a pre-preg may include, but are not limited to, a multi-layer structure formed by stacking or laminating a number of pre-impregnated materials/sheets. In some embodiments, there may be any number of conductive layers 11c depending on design specifications. In some embodiments, the conductive layer 11c is formed of or includes Au, Ag, Cu, Pt, Pd, or an alloy thereof.

The package body 17 is disposed on the surface 112 of the circuit layer 11. The package body 17 covers the carrier 10 and the conductive layer 10p. The package body covers the surface 102 and the lateral surface 103 of the carrier 10 and a lateral surface of the adhesive layer 10a. In some embodiments, the package body 17 has a lateral surface 173 substantially coplanar with the lateral surface 113 of the circuit layer 11. The lateral surface 103 of the carrier 10 is recessed from the lateral surface 173 of the package body 17. For example, there is a distance between the lateral surface 103 of the carrier 10 and the lateral surface 173 of the package body 17. In some embodiments, the package body 17 includes an epoxy resin including fillers, a molding compound (e.g., an epoxy molding compound or other molding compound), a polyimide, a phenolic compound or material, a material including a silicone dispersed therein, or a combination thereof.

One or more interconnection structures 12a (e.g., conductive pillars or conductive elements) are disposed on the surface 111 of the circuit layer 11. The interconnection structures 12a are electrically connected to the circuit layer 11 (e.g., to the conductive layer 11c exposed from the dielectric layer 11d). In some embodiments, the interconnection structures 12a define an antenna structure. The interconnection structure 12a is, or includes, a conductive material such as a metal or metal alloy. Examples of the conductive material include Au, Ag, Cu, Pt, Pd, or an alloy thereof.

The package body 18 is disposed on the surface 111 of the circuit layer 11. The package body 18 covers the interconnection structures 12a. In some embodiments, the package body 18 has a lateral surface 183 substantially coplanar with the lateral surface 113 of the circuit layer 11. In some embodiments, the package body 18 includes an epoxy resin including fillers, a molding compound (e.g., an epoxy molding compound or other molding compound), a polyimide, a phenolic compound or material, a material including a silicone dispersed therein, or a combination thereof.

The circuit layer 13 (or building-up circuit) is disposed on the package body 18. The circuit layer 13 has a dielectric layer 13d and a conductive layer 13c. In some embodiments, the dielectric layer 13d may include the same material as the dielectric layer 11d. Alternatively, the dielectric layer 13d and the dielectric layer 11d may include different materials. The conductive layer 13c is disposed on a surface of the dielectric layer 11d facing the circuit layer 11. The conductive layer 13c is covered or encapsulated by the package body 18. The conductive layer 13c is electrically connected to the interconnection structures 12a. The conductive layer 13c is in contact with the interconnection structures 12a. In some embodiments, there may be any number of conductive layers 13c depending on design specifications.

One or more interconnection structures 12b (e.g., conductive pillars or conductive elements) are disposed on a surface of the circuit layer 13 facing away from the circuit layer 11. The interconnection structures 12b are electrically connected to the circuit layer 13. The interconnection structure 12b is, or includes, a conductive material such as a metal or metal alloy. Examples of the conductive material include Au, Ag, Cu, Pt, Pd, or an alloy thereof.

The package body 19 is disposed on the surface of the circuit layer 13 facing away from the circuit layer 11. The package body 19 covers the interconnection structures 12b and the electronic component 15. In some embodiments, the package body 19 has a lateral surface substantially coplanar with the lateral surface of the circuit layer 13. In some embodiments, the package body 19 includes an epoxy resin including fillers, a molding compound (e.g., an epoxy molding compound or other molding compound), a polyimide, a phenolic compound or material, a material including a silicone dispersed therein, or a combination thereof.

The circuit layer 14 (or building-up circuit) is disposed on the package body 19. The circuit layer 14 has a dielectric layer 14d and a conductive layer 14c. In some embodiments, the dielectric layer 14d may include the same material as the dielectric layer 11d. Alternatively, the dielectric layer 14d and the dielectric layer 11d may include different materials. The conductive layer 13c is disposed on a surface of the dielectric layer 14d facing away from the circuit layer 13. The conductive layer 14c is electrically connected to the interconnection structures 12b. In some embodiments, there may be any number of conductive layers 14c depending on design specifications.

The electronic component 15 is disposed on the surface of the circuit layer 14 facing the circuit layer 13. The electronic component 15 may be an active electronic component, such as an integrated circuit (IC) chip or a die. The electronic component 15 has a backside surface bonded or attached to the surface of the circuit layer 14 by an adhesion layer 15a (e.g., DAF). The electronic component 15 has an active surface facing the circuit layer 13 and electrically connected to the circuit layer 13 through the interconnection structures 15c (e.g., conducive pillars).

The electrical contacts 16 are disposed on the conductive layer 14c exposed from the dielectric layer 14d. In some embodiments, the electrical contacts 16 may include solder or other suitable material(s).

In some embodiments, the lateral surface 103 of the carrier 10 may be coplanar with the lateral surface 113 of the circuit layer 11. For example, the lateral surface 103 of the carrier 10 is exposed from the package body 17. Such structure may be formed by: (i) providing a glass wafer; (ii) forming the circuit layers 11, 13, 14, the interconnection structures 12a, 12b and the package bodies 17, 18, 19 and the electronic component 15 on the glass wafer; and (iii) performing a singulation through the circuit layers 11, 13, 14, the package bodies 17, 18, 19 and the carrier wafer. To meeting the criterion of the performance of the antenna structure, the glass wafer should select a material having a relatively low Dk (e.g., less than 5). However, a glass wafer having a relatively low Dk would have a relatively low CTE as well (e.g., less than 13). Due to a CTE mismatch between the glass wafer and the package body 17 (e.g., the package body generally has a CTE greater than 20), the warpage issues would occur. As the size of the glass wafer increases, the warpage issue becomes severer, which may result in the crack or damage of the glass wafer.

In accordance with the embodiments as shown in FIG. 1, the lateral surface 103 of the carrier 10 is recessed from the lateral surface 111 of the circuit layer 11. Such structure may be formed by (detailed operations would be described later): (i) performing a singulation for a glass wafer to divide the glass wafer into a plurality glass carriers (e.g., the carrier 10 as shown in FIG. 1); (ii) forming the circuit layers 11, 13, 14, the interconnection structures 12a, 12b and the package bodies 17, 18, 19 and the electronic component 15; and (iii) attaching the carrier 10 on the circuit layer 11 through the adhesive layer 10a. Since the size of the divided glass carrier is much less than that of the glass wafer, the warpage issue can be significantly mitigated. In addition, since it is unnecessary to select a material of the carrier 10 having a higher CTE to be close to the CTE of the package body 17, materials having lower CTE (also having lower Dk) can be selected as the carrier 10. This would enhance the performance of the antenna structure of the semiconductor device package 1. Furthermore, the thickness of the carrier 10 can be reduced as well, which would facilitate the miniaturization of the semiconductor device package 1.

Figure 2:
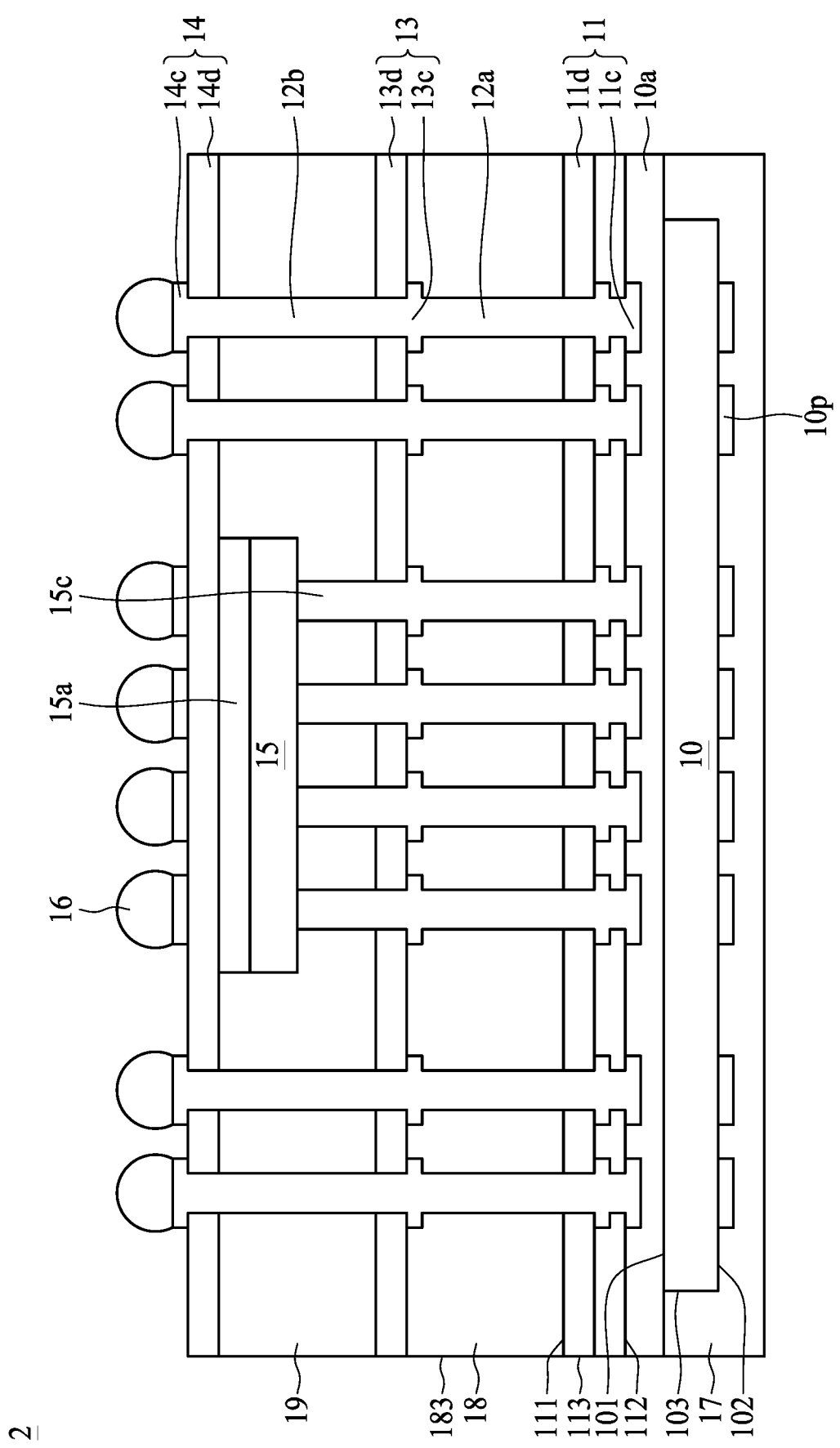
FIG. 2 illustrates a cross-sectional view of a semiconductor device package in accordance with some embodiments of the present disclosure.

FIG. 2 illustrates a cross-sectional view of a semiconductor device package 2 in accordance with some embodiments of the present disclosure. The semiconductor device package 2 is similar to the semiconductor device package 1 as shown in FIG. 1, and one of the differences therebetween is that in FIG. 2, a width of the adhesive layer 10a is greater than a width of the carrier 10. For example, a lateral surface of the adhesive layer 10a is substantially coplanar with the lateral surface 113 of the circuit layer 11. For example, the lateral surface 103 of the carrier 10 is recessed from the lateral surface of the adhesive layer 10a. This would increase the accuracy of the alignment between the carrier 10 and the circuit layer 11 during the manufacturing process.

Figure 3:
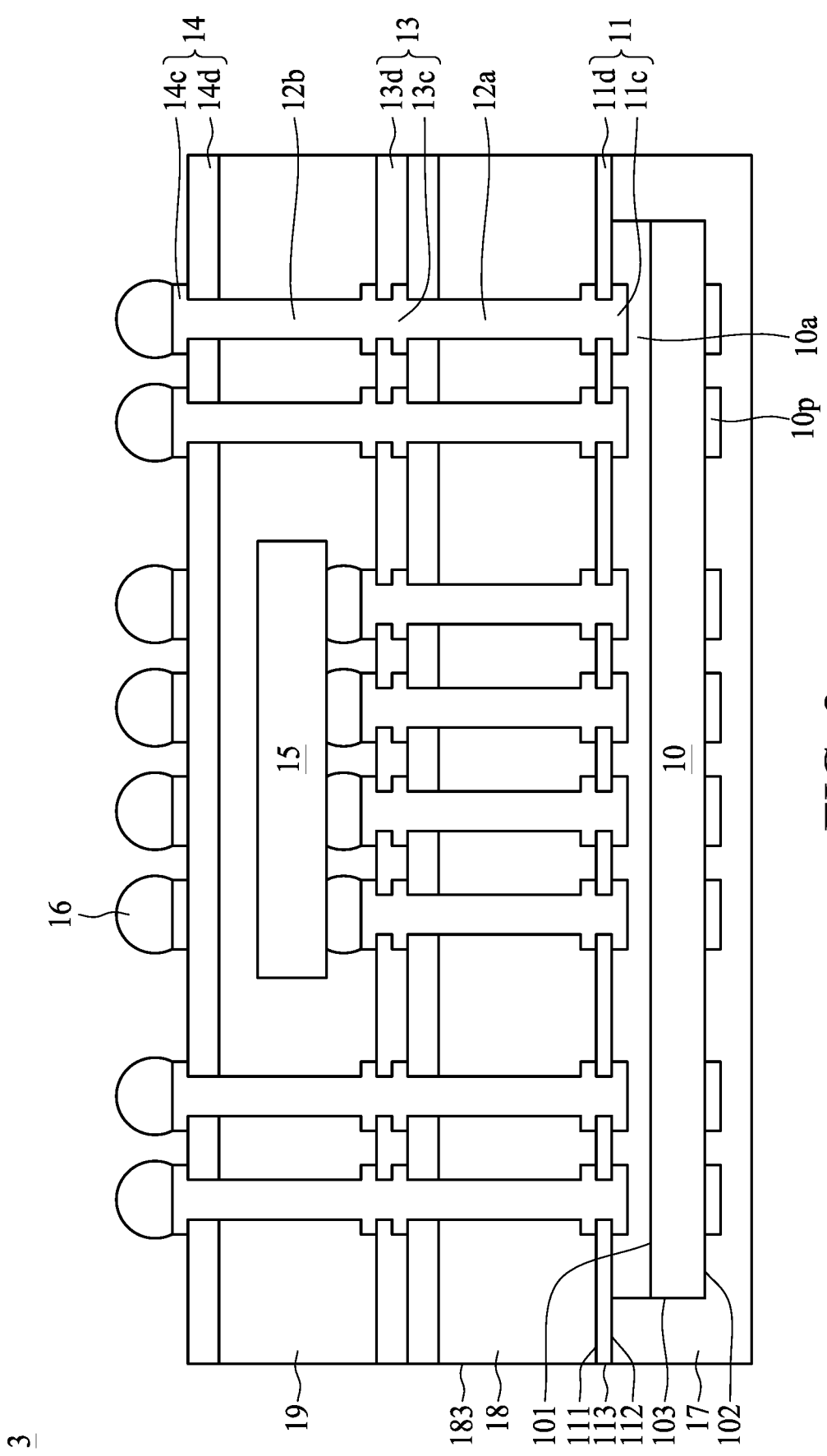
FIG. 3 illustrates a cross-sectional view of a semiconductor device package in accordance with some embodiments of the present disclosure.

FIG. 3 illustrates a cross-sectional view of a semiconductor device package 3 in accordance with some embodiments of the present disclosure. The semiconductor device package 3 is similar to the semiconductor device package 1 as shown in FIG. 1, and the differences therebetween are described below.

The electronic component 15 is disposed on a surface of the circuit layer 13 facing away from the circuit layer 11. The active surface of the electronic component 15 faces the circuit layer 13. The electronic component 15 is electrically connected to the circuit layer 13 (e.g., to the conductive layer 13c) through electrical contacts (e.g., solder balls), and the electrical connection can be achieved by, for example, flip-chip technique.

Figure 4:
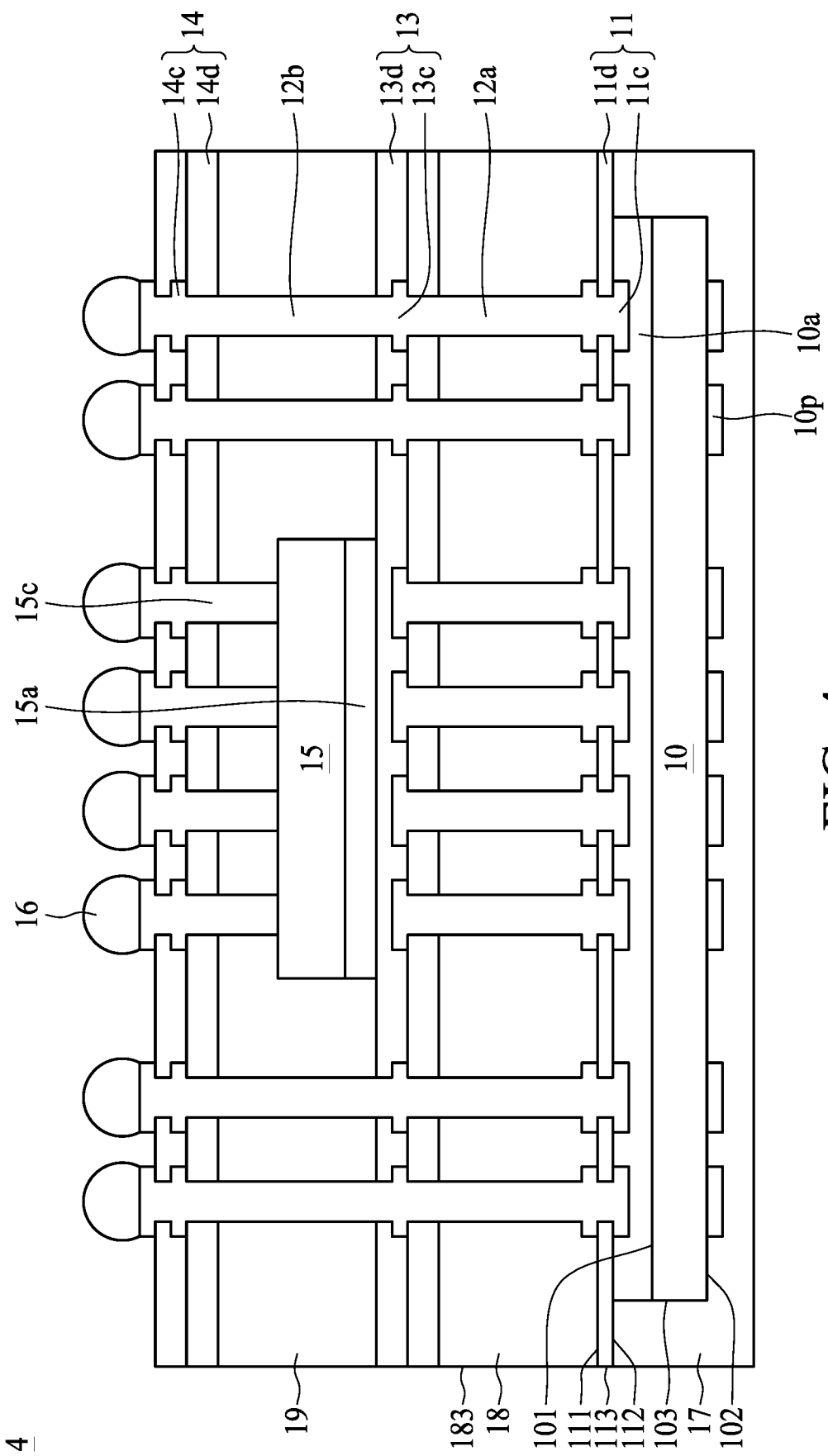
FIG. 4 illustrates a cross-sectional view of a semiconductor device package in accordance with some embodiments of the present disclosure.

FIG. 4 illustrates a cross-sectional view of a semiconductor device package 4 in accordance with some embodiments of the present disclosure. The semiconductor device package 4 is similar to the semiconductor device package 1 as shown in FIG. 1, and the differences therebetween are described below.

The electronic component 15 is disposed on a surface of the circuit layer 13 facing away from the circuit layer 11. The backside surface of the electronic component 15 is connected to the circuit layer 13 through the adhesive layer 15a. The electronic component 15 is electrically connected to the circuit layer 14 (e.g., to the conductive layer 14c) through the interconnection structures 15c (e.g., Cu pillars).

Figure 5A:
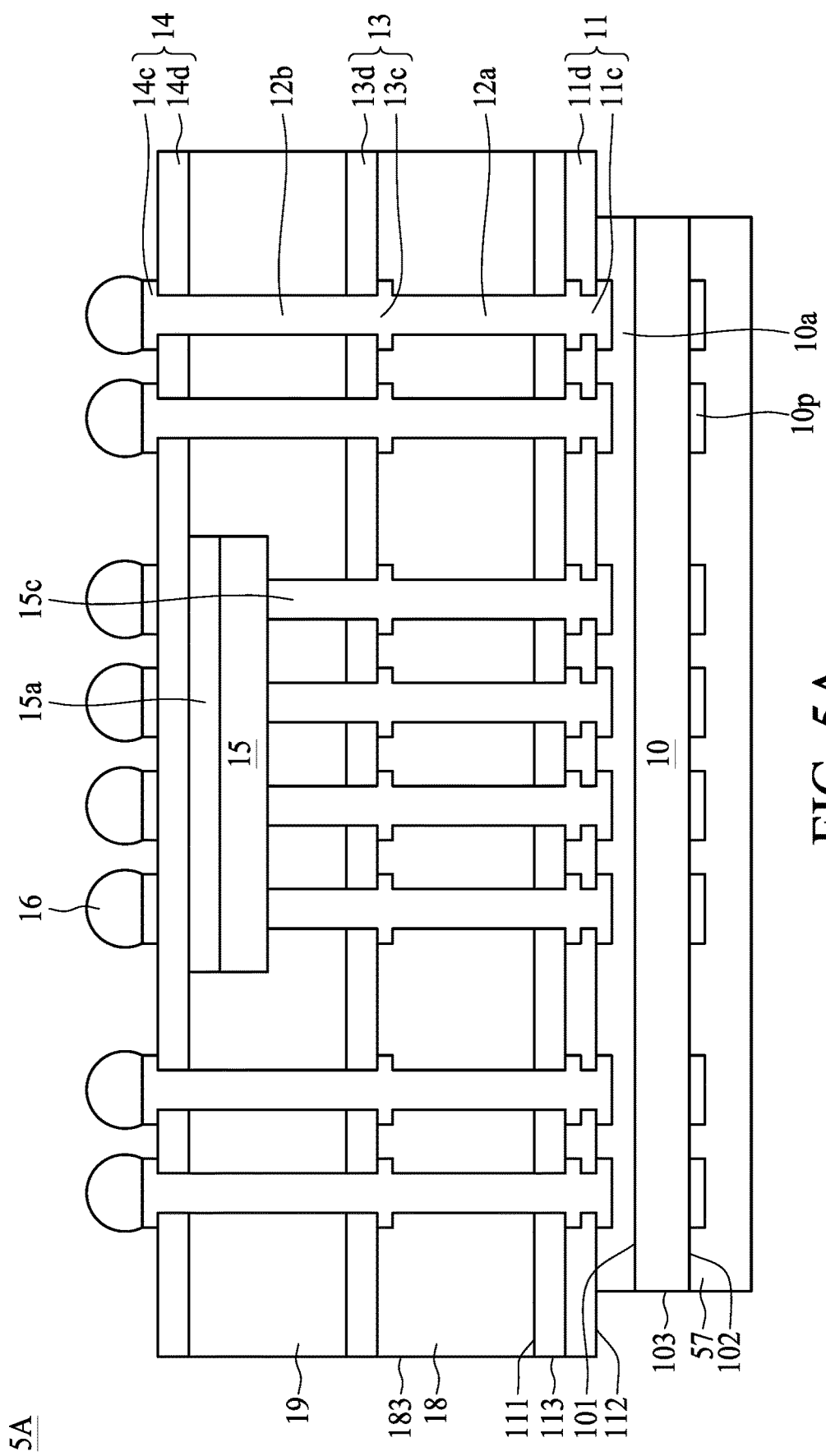
FIG. 5A illustrates a cross-sectional view of a semiconductor device package in accordance with some embodiments of the present disclosure.

FIG. 5A illustrates a cross-sectional view of a semiconductor device package 5A in accordance with some embodiments of the present disclosure. The semiconductor device package 5A is similar to the semiconductor device package 1 as shown in FIG. 1, and the differences therebetween are described below.

In FIG. 5A, the package body 17 is omitted. A protection layer (or protection film) 57 is disposed on the surface 102 of the carrier 10 to cover the conductive layer 10p. In some embodiments, a width of the protection layer 57 is substantially the same as a width of the carrier 10. For example, a lateral surface of the protection layer 57 is substantially coplanar with the lateral surface 103 of the carrier 10. In accordance with the embodiments of FIG. 5A, replacing the package body (e.g., a molding compound) with the protection layer 57 can reduce the time and cost for manufacturing the semiconductor device package 5A. In addition, the thickness of the semiconductor device package 5A can be reduced as well.

Figure 5B:
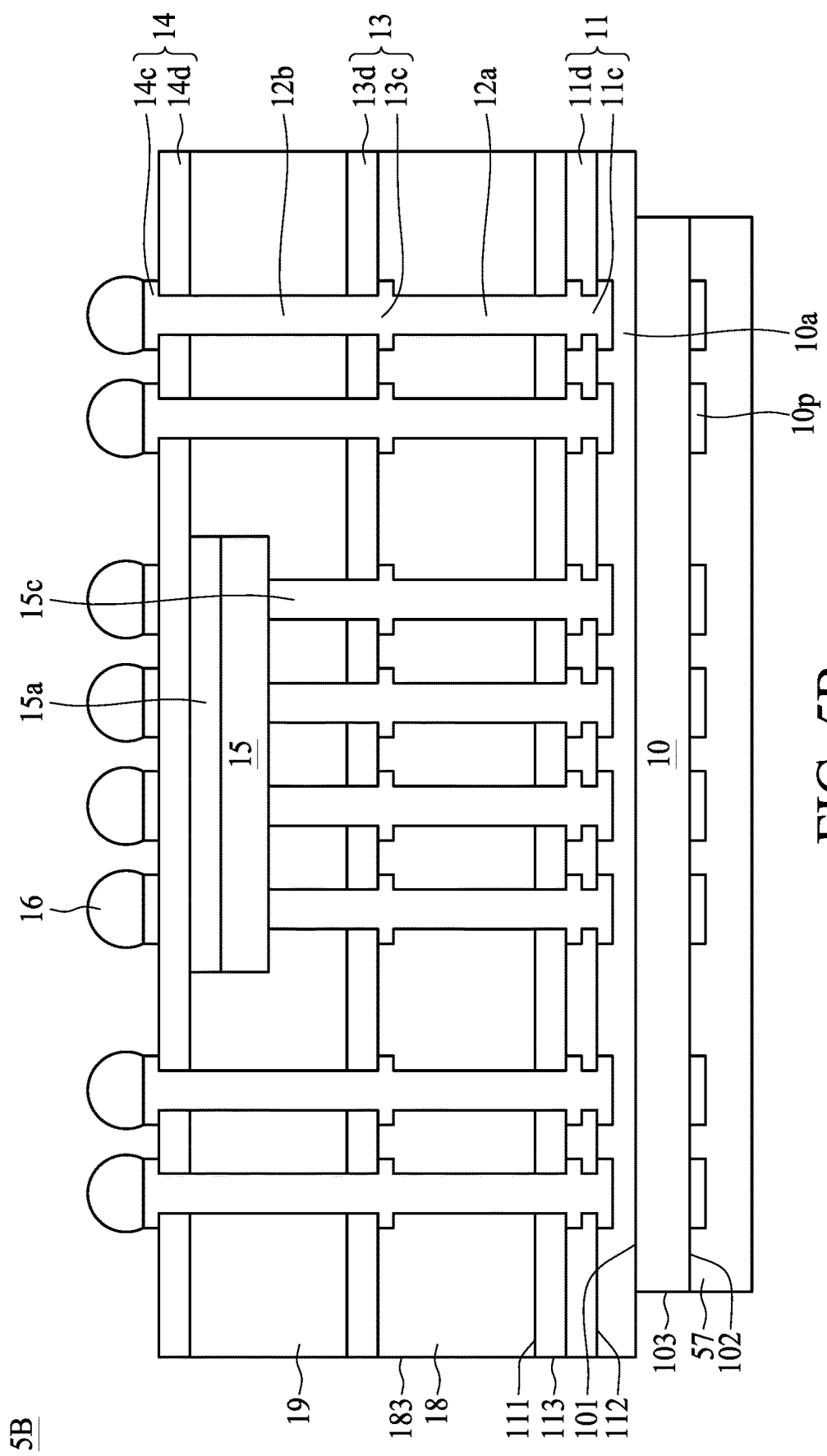
FIG. 5B illustrates a cross-sectional view of a semiconductor device package in accordance with some embodiments of the present disclosure.

FIG. 5B illustrates a cross-sectional view of a semiconductor device package 5B in accordance with some embodiments of the present disclosure. The semiconductor device package 5B is similar to the semiconductor device package 5A as shown in FIG. 5A, and one of the differences is that a width of the adhesive layer 10a is greater than a width of the carrier 10. For example, a lateral surface of the adhesive layer 10a is substantially coplanar with the lateral surface 113 of the circuit layer 11. For example, the lateral surface 103 of the carrier 10 is recessed from the lateral surface of the adhesive layer 10a. This would increase the accuracy of the alignment between the carrier 10 and the circuit layer 11 during the manufacturing process.

Figure 5C:
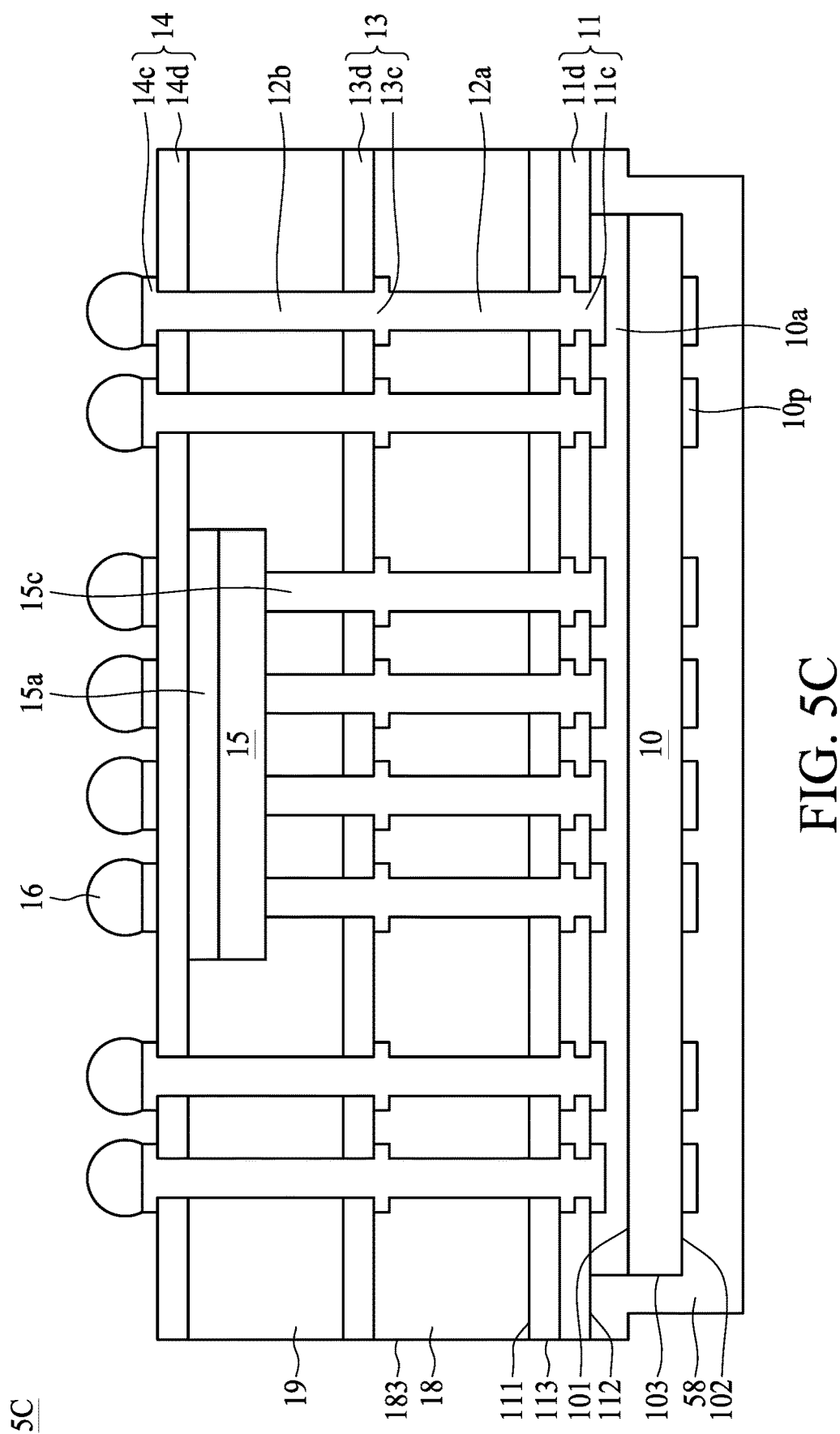
FIG. 5C illustrates a cross-sectional view of a semiconductor device package in accordance with some embodiments of the present disclosure.

FIG. 5C illustrates a cross-sectional view of a semiconductor device package 5C in accordance with some embodiments of the present disclosure. The semiconductor device package 5C is similar to the semiconductor device package 1 as shown in FIG. 1, and the differences therebetween are described below.

In FIG. 5C, the package body 17 is omitted. A protection layer (or protection film) 58 covers the surface 112 of the circuit layer 11, the lateral surface 103 and the surface 102 of the carrier 10. The protection layer 58 has a first lateral surface coplanar with the lateral surface 113 of the circuit layer 11 and a second lateral surface recessed from the first lateral surface.

Figure 5D:
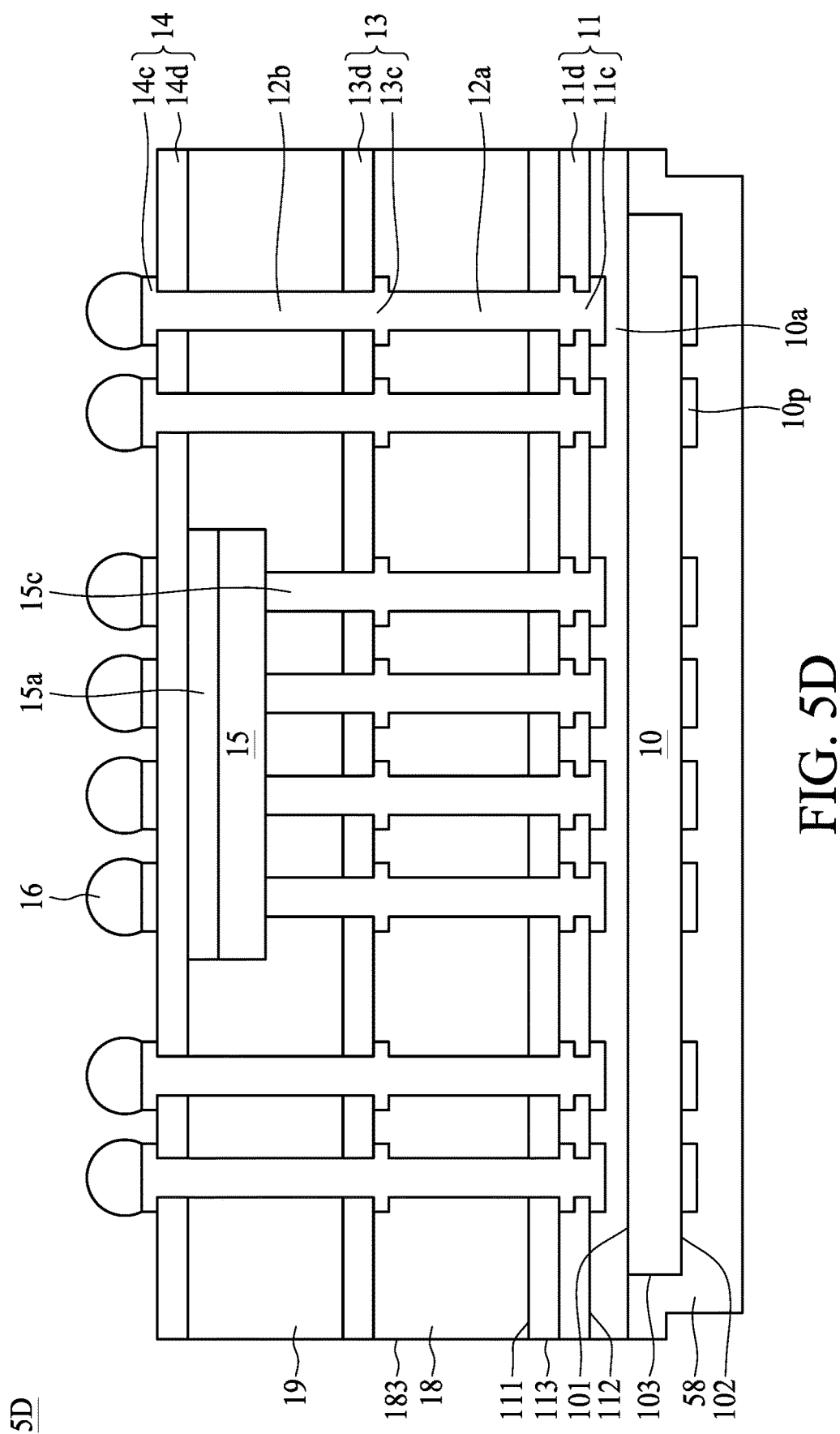
FIG. 5D illustrates a cross-sectional view of a semiconductor device package in accordance with some embodiments of the present disclosure.

FIG. 5D illustrates a cross-sectional view of a semiconductor device package 5D in accordance with some embodiments of the present disclosure. The semiconductor device package 5D is similar to the semiconductor device package 5C as shown in FIG. 5C, and one of the differences is that a width of the adhesive layer 10a is greater than a width of the carrier 10. For example, a lateral surface of the adhesive layer 10a is substantially coplanar with the lateral surface 113 of the circuit layer 11. For example, the lateral surface 103 of the carrier 10 is recessed from the lateral surface of the adhesive layer 10a. This would increase the accuracy of the alignment between the carrier 10 and the circuit layer 11 during the manufacturing process.

Figure 6:
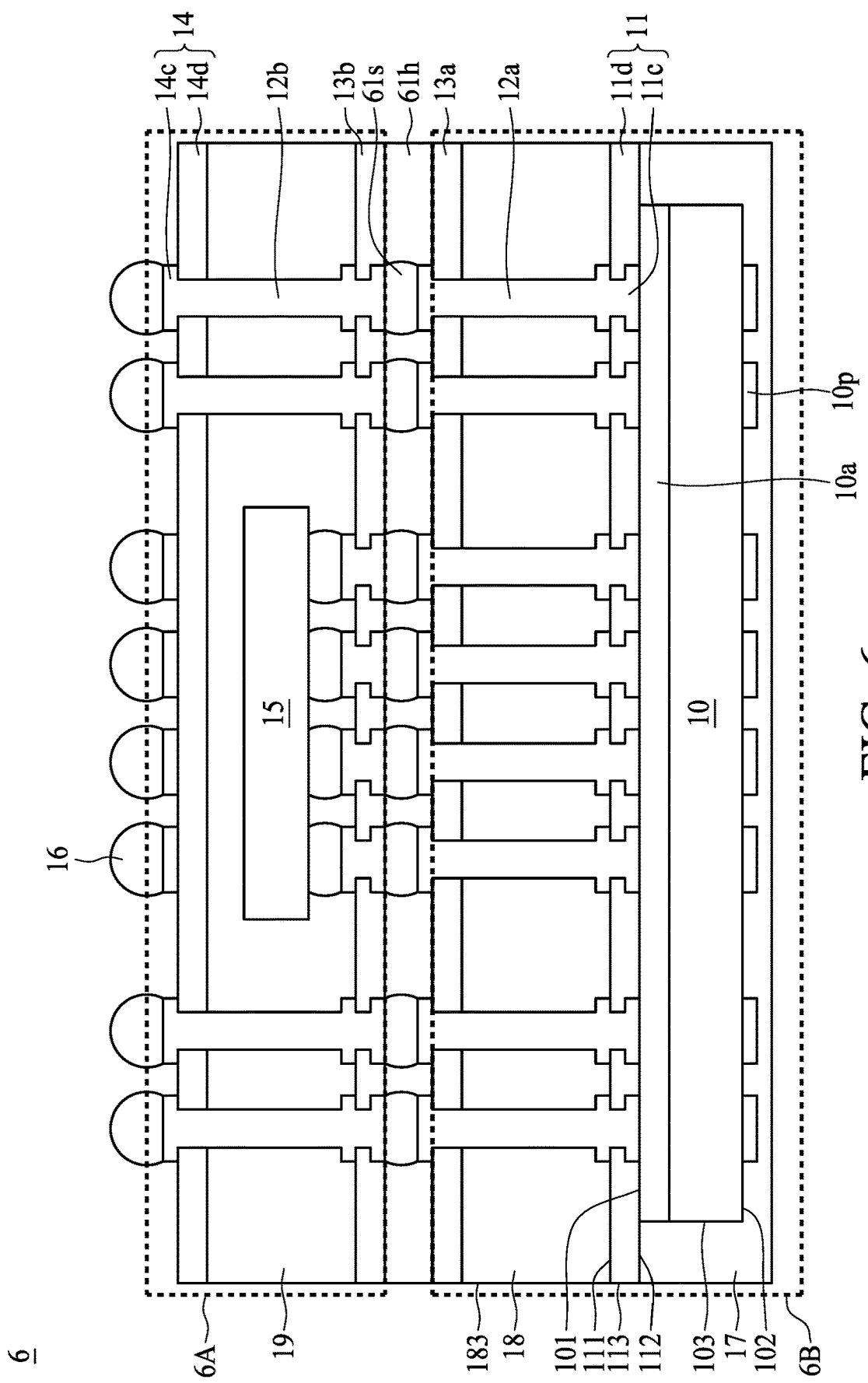
FIG. 6 illustrates a cross-sectional view of a semiconductor device package in accordance with some embodiments of the present disclosure.

FIG. 6 illustrates a cross-sectional view of a semiconductor device package 6 in accordance with some embodiments of the present disclosure. The semiconductor device package 6 is similar to the semiconductor device package 3 as shown in FIG. 3, and the differences therebetween are described below.

The semiconductor device package 6 may include two parts 6A and 6B. The part 6A includes the dielectric layer 13b, the package body 19, the electronic component 15, the circuit layer 14, and the interconnection structures 12b. The part 6B includes the dielectric layer 13a, the package bodies 17, 18, the circuit layer 11 and the carrier 10. The part 6A and the part 6B may be manufactured individually and then connected to each other through electrical contacts 61s (e.g., solder balls). This would increase the yield rate of the semiconductor device package 6. In some embodiments, an underfill 61h may be disposed between the part 6A and the part 6B to cover the electrical contacts 61s. In some embodiments, a width of the part 6A is the same as a width of the part 6B. Alternatively, the width of the part 6A may be greater than or less than the width of the part 6B depending on design specifications.

Figure 7:
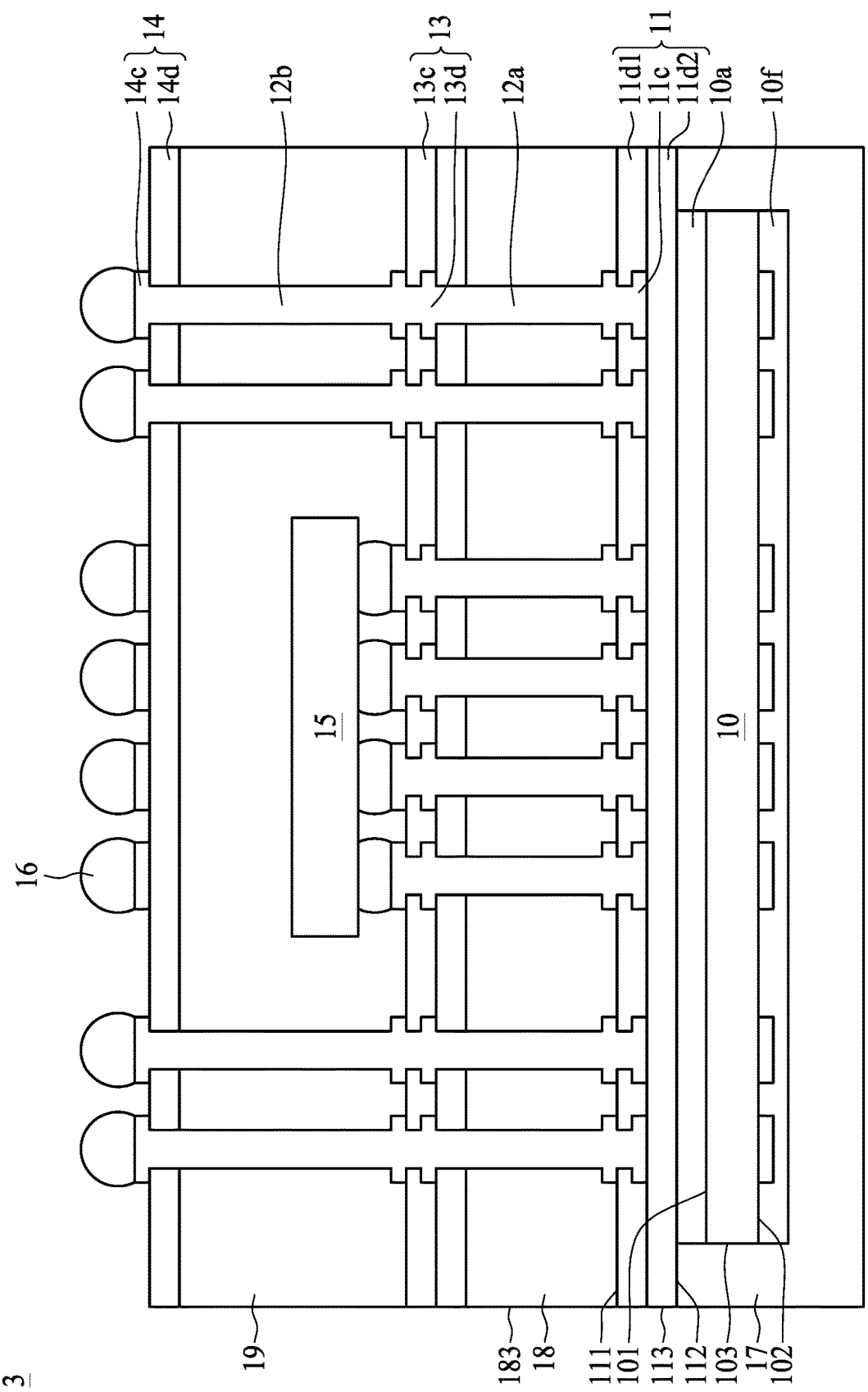
FIG. 7 illustrates a cross-sectional view of a semiconductor device package in accordance with some embodiments of the present disclosure.

FIG. 7 illustrates a cross-sectional view of a semiconductor device package 7 in accordance with some embodiments of the present disclosure. The semiconductor device package 7 is similar to the semiconductor device package 3 as shown in FIG. 3, and the differences therebetween are described below.

In FIG. 7 the conductive layer 11c is spaced apart from the adhesive layer 10a. For example, the conductive layer 11c is not embedded with the adhesive layer 10a as shown in FIG. 3. The conductive layer 11c may be separated from the adhesive layer 10a by the dielectric layer 11d2 (or a passivation layer). In some embodiments, a surface of the conductive layer 11c facing the carrier 10 is substantially coplanar with a surface of the dielectric layer 11d1 (e.g., a bottommost surface) facing the carrier 10. In some embodiments, the semiconductor device package 7 may further include a protection layer 10f (or protection film) disposed on the surface 102 of the carrier 10 to cover the conductive layer 10p.

FIG. 8A, FIG. 8B, FIG. 8C, FIG. 8D, FIG. 8E, FIG. 8F, FIG. 8G, FIG. 8H and FIG. 8I illustrate a semiconductor manufacturing method in accordance with some embodiments of the present disclosure. In some embodiments, the method in FIG. 8A, FIG. 8B, FIG. 8C, FIG. 8D, FIG. 8E, FIG. 8F, FIG. 8G, FIG. 8H and FIG. 8I can be used to manufacture the semiconductor device package 1 in FIG. 1.

Figure 8A:
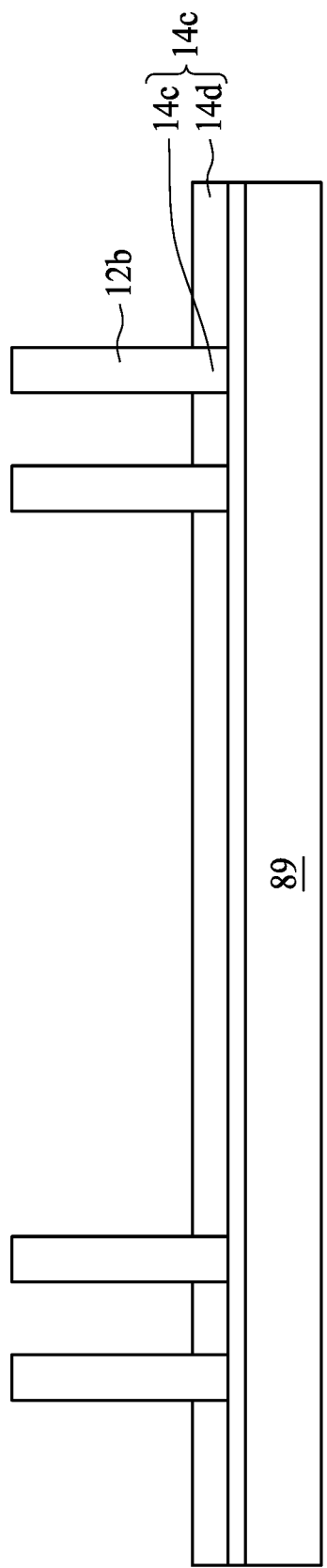
FIG. 8A, FIG. 8B, FIG. 8C, FIG. 8D, FIG. 8E, FIG. 8F, FIG. 8G, FIG. 8H and FIG. 8I illustrate a semiconductor manufacturing method in accordance with some embodiments of the present disclosure.

Referring to FIG. 8A, a carrier 89 is provided. A circuit layer 14 including a conductive layer 14c and a dielectric layer 14d is formed on the carrier 89. Interconnection structures 12b are then formed on the circuit layer 14 to be electrically connected to the circuit layer 14. The dielectric layer 13d is formed by, for example but is not limited to, photolithographic technique. In some embodiments, the interconnection structures 12b may be formed by, for example but is not limited to, plating technique.

Figure 8B:
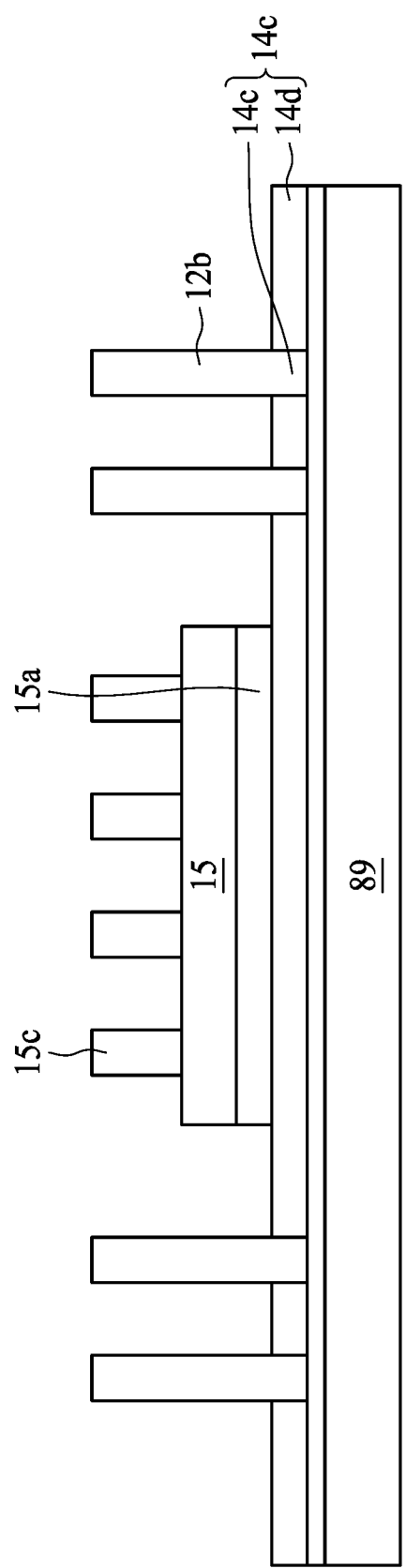

Referring to FIG. 8B, an electronic component 15 is disposed on the circuit layer 14. In some embodiments, a backside surface of the electronic component 15 is attached to the circuit layer 14 through an adhesive layer 15a. Interconnection structures 15c are then formed on an active surface of the electronic component 15 to be electrically connected to the electronic component 15.

Figure 8C:
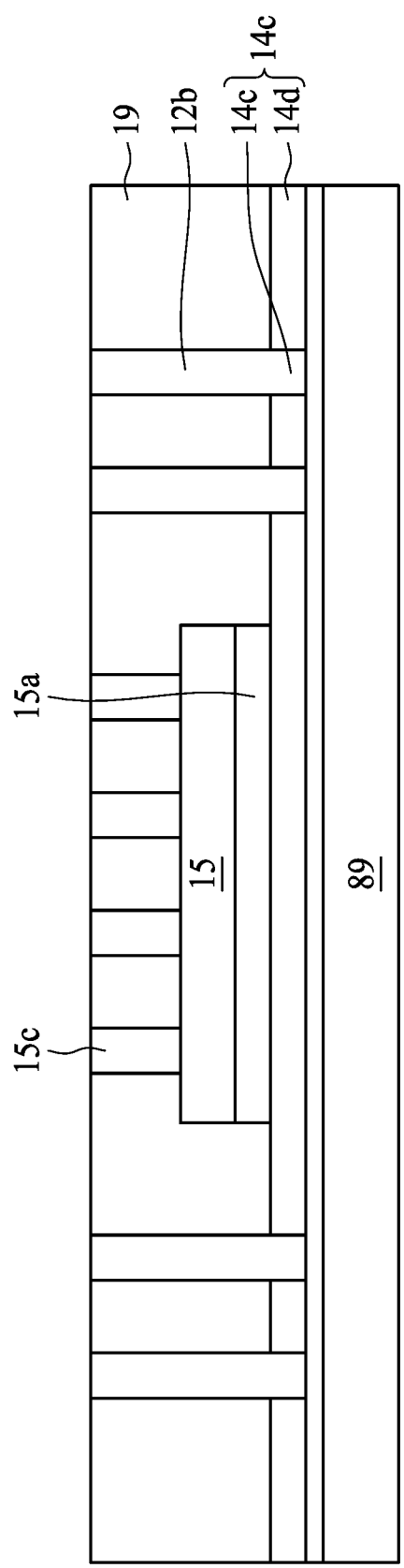

Referring to FIG. 8C, a package body 19 is formed on the circuit layer 14 to cover the interconnection structures 12b, 15c and the electronic component 15. In some embodiments, the package body 19 may be formed to fully cover the interconnection structures 12b, 15c and the electronic component 15. A portion of the package body 19 is removed by, for example, grinding or any other suitable techniques to expose a top portion of the interconnection structures 12b and 15c for electrical connections. In some embodiments, the package body 19 is formed by, for example, by a transfer molding technique, a compression technique or any other suitable techniques.

Figure 8D:
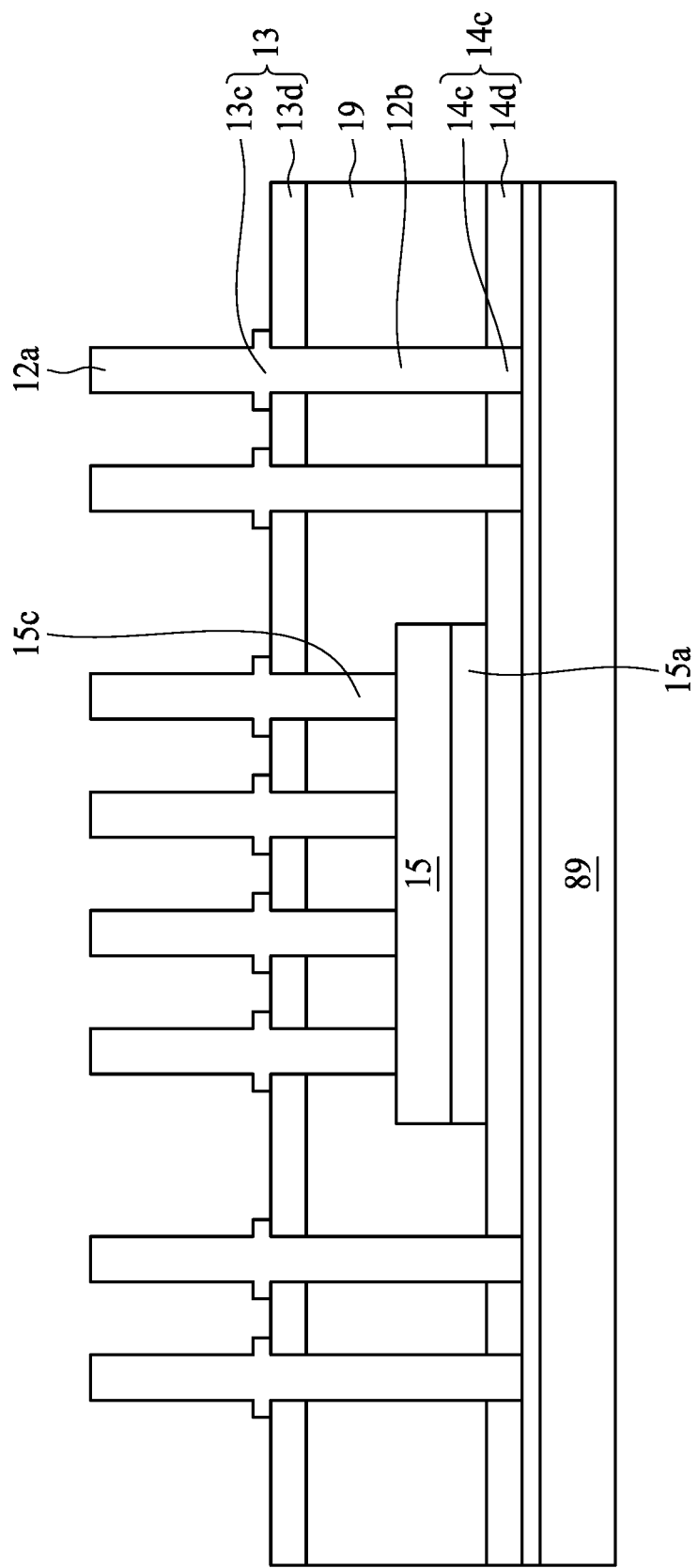

Referring to FIG. 8D, a circuit layer 13 including a conductive layer 13c and a dielectric layer 13d is formed on the package body 19 and electrically connected to the interconnection structures 12b and 15c exposed from the package body 19. Interconnection structures 12a are then formed on the circuit layer 13 to be electrically connected to the circuit layer 13. The dielectric layer 13d is formed by, for example but is not limited to, photolithographic technique.

In some embodiments, the interconnection structures 12a may be formed by, for example but is not limited to, plating technique.

Figure 8E:
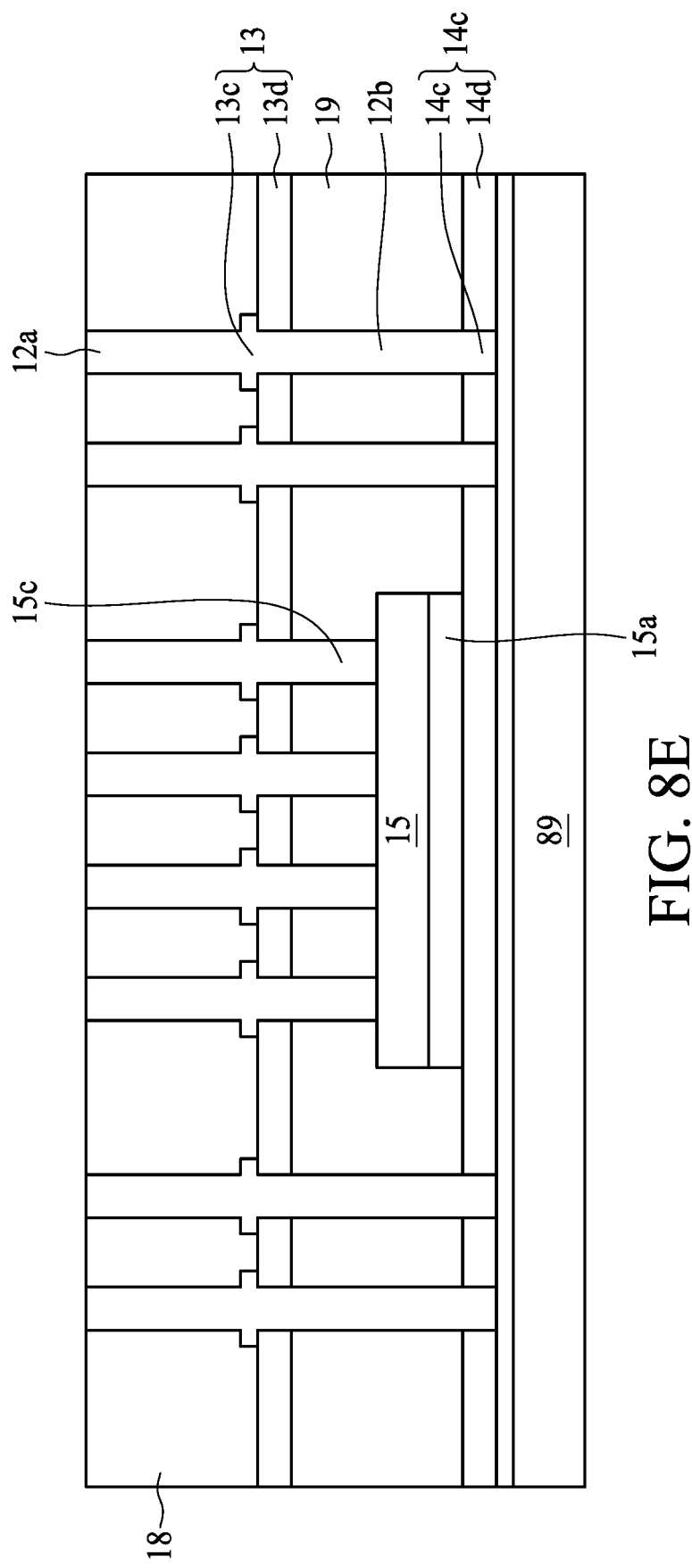

Referring to FIG. 8E, a package body 18 is formed on the circuit layer 13 to cover the interconnection structures 12a. In some embodiments, the package body 18 may be formed to fully cover the interconnection structures 12a. A portion of the package body 18 is removed by, for example, grinding or any other suitable techniques to expose a top portion of the interconnection structures 12a for electrical connections. In some embodiments, the package body 18 is formed by, for example, by a transfer molding technique, a compression technique or any other suitable techniques.

Figure 8F:
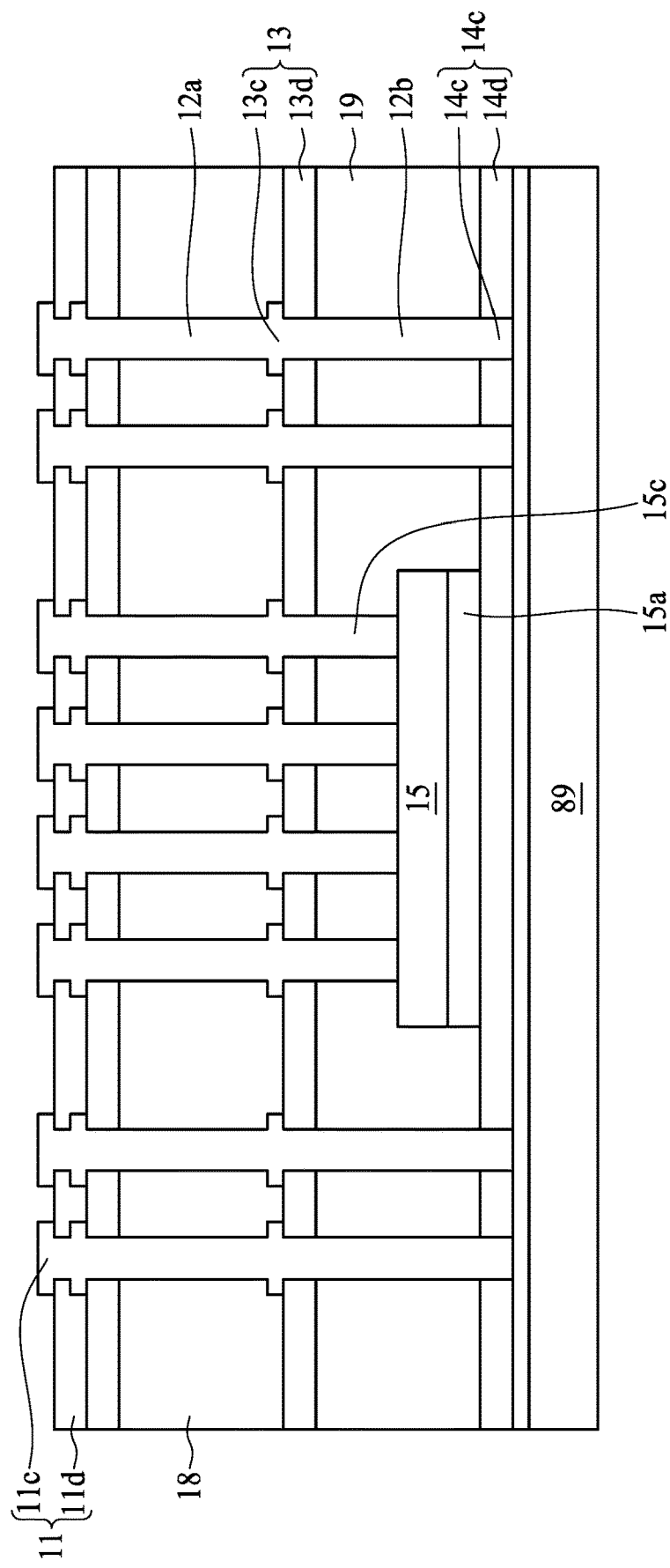

Referring to FIG. 8F, a circuit layer 11 including a conductive layer 11c and a dielectric layer 11d is formed on the package body 18 and electrically connected to the interconnection structures 12a exposed from the package body 18. The dielectric layer 11d is formed by, for example but is not limited to, photolithographic technique.

Figure 8G:
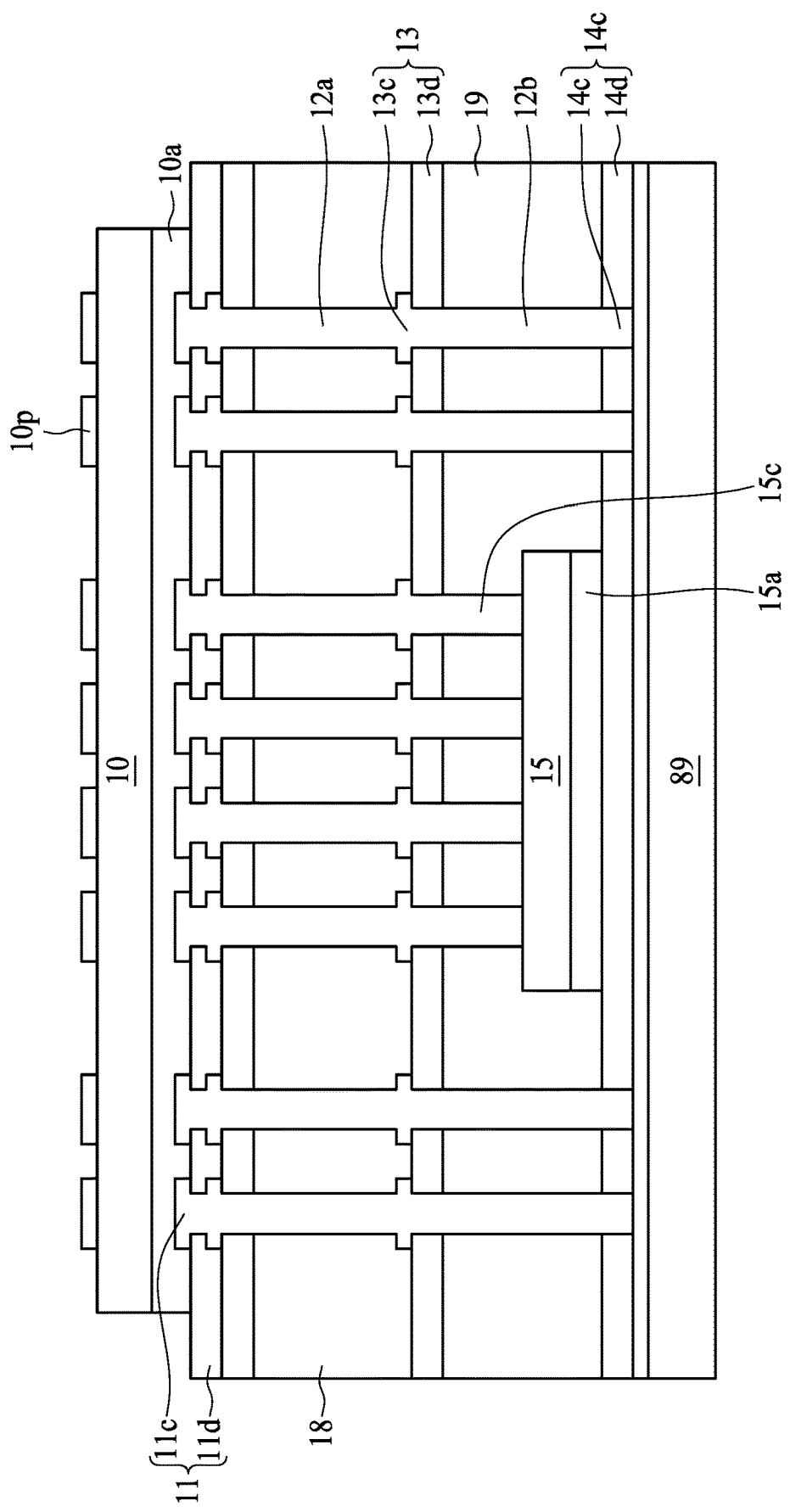

Referring to FIG. 8G, a carrier 10 having a conductive layer 10p thereon is disposed on the circuit layer 11. In some embodiments, the carrier 10 is attached to the circuit layer 11 through an adhesive layer 10a. In some embodiments, the carrier 10 may be formed by performing a singulation to divide a glass wafer into a plurality of glass carriers including the carrier 10.

Figure 8H:
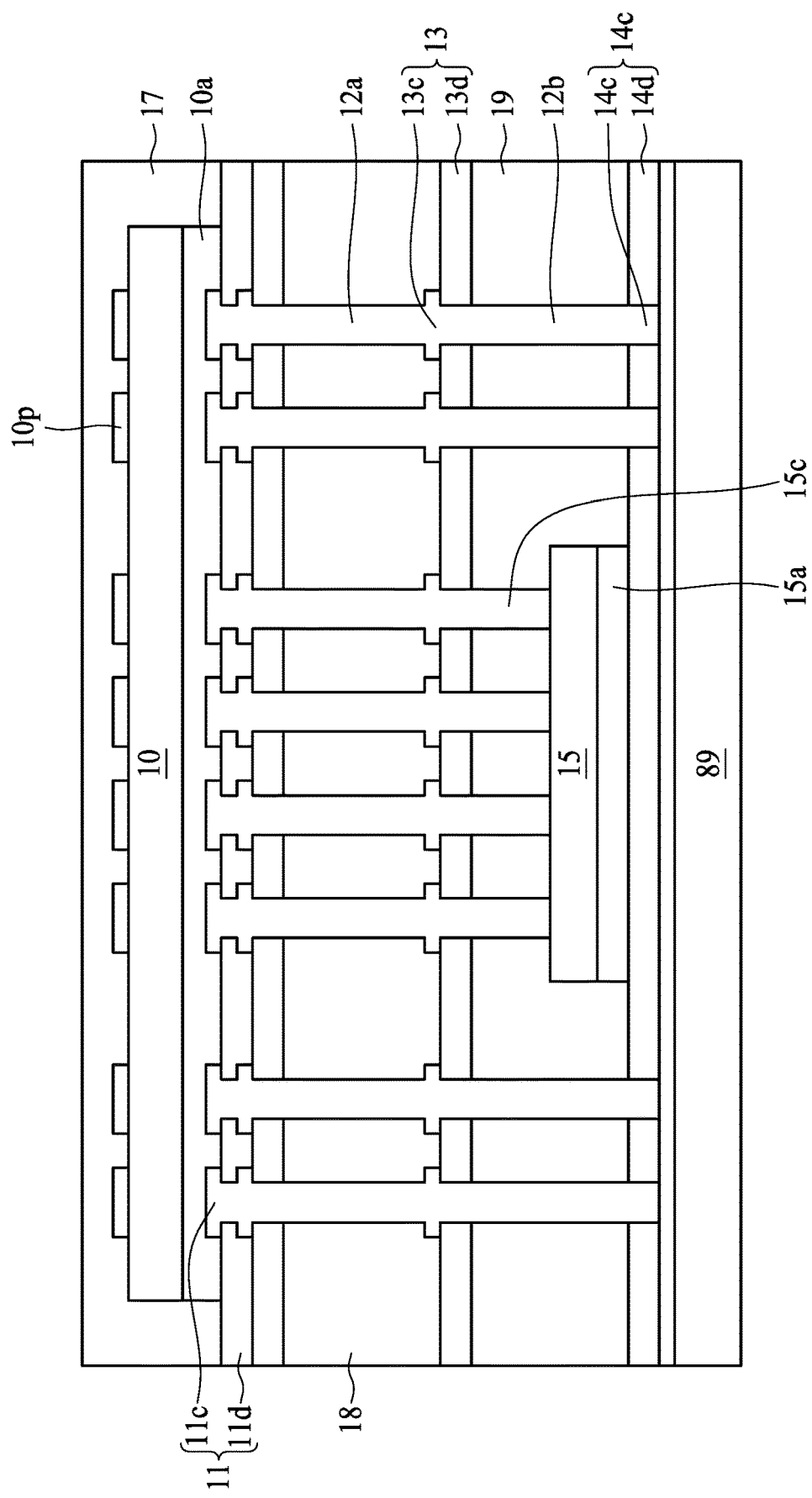

Referring to FIG. 8H, a package body 17 is formed on the circuit layer 11 to cover the carrier 10 and the conductive layer 10p. In some embodiments, the package body 17 is formed by, for example, by a transfer molding technique, a compression technique or any other suitable techniques. In some embodiments, the package body 17 may be replaced by forming a protection layer 57 or 58 as shown in FIG. 5A, 5B, 5C or 5D.

Figure 8I:
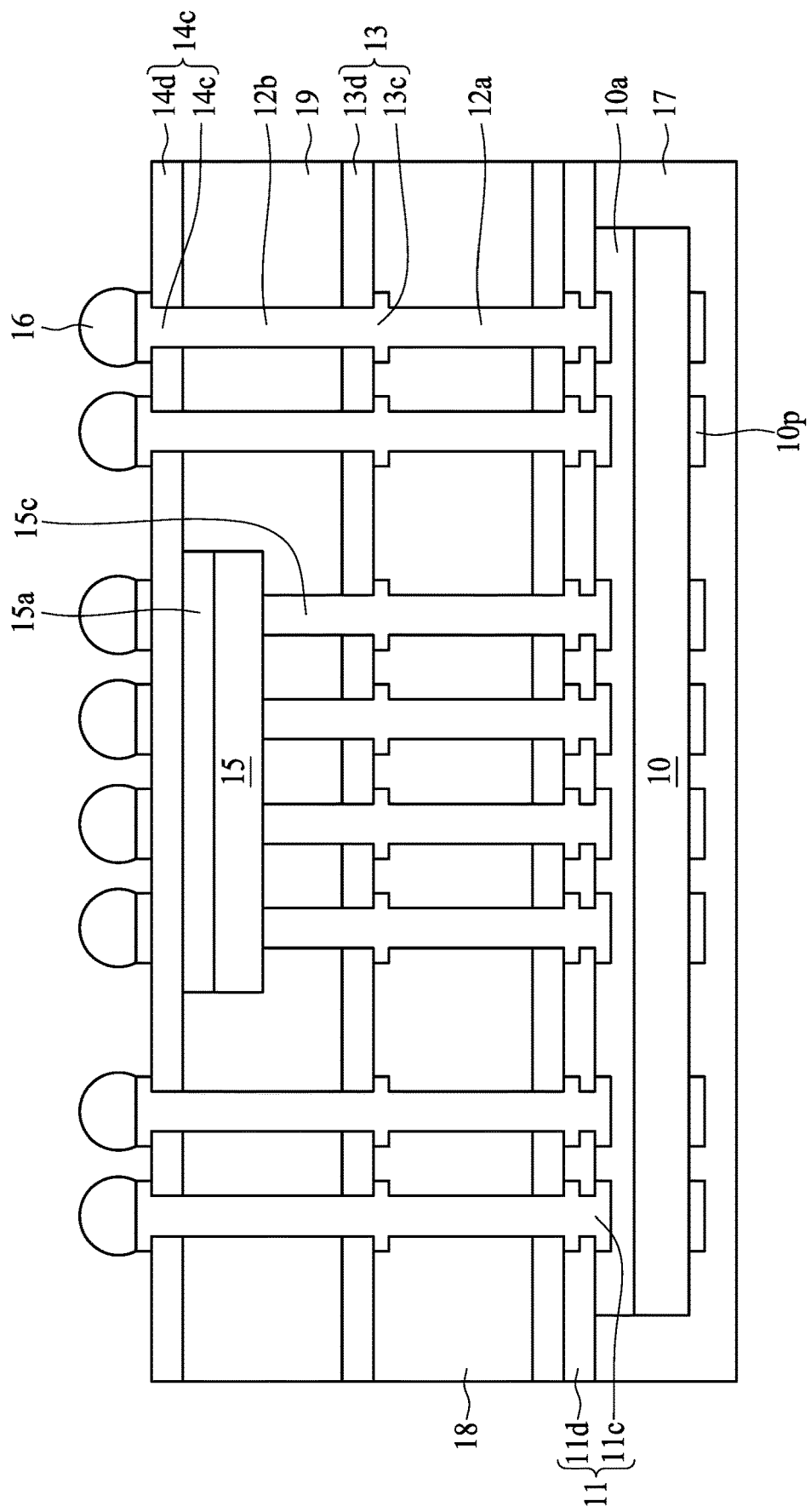

Referring to FIG. 8I, the carrier 89 is removed from the circuit layer 14 to expose the conductive layer 14c. Electrical contacts 16 are then disposed on the conductive layer 14c exposed from the dielectric layer 14d.

Figure 9A:
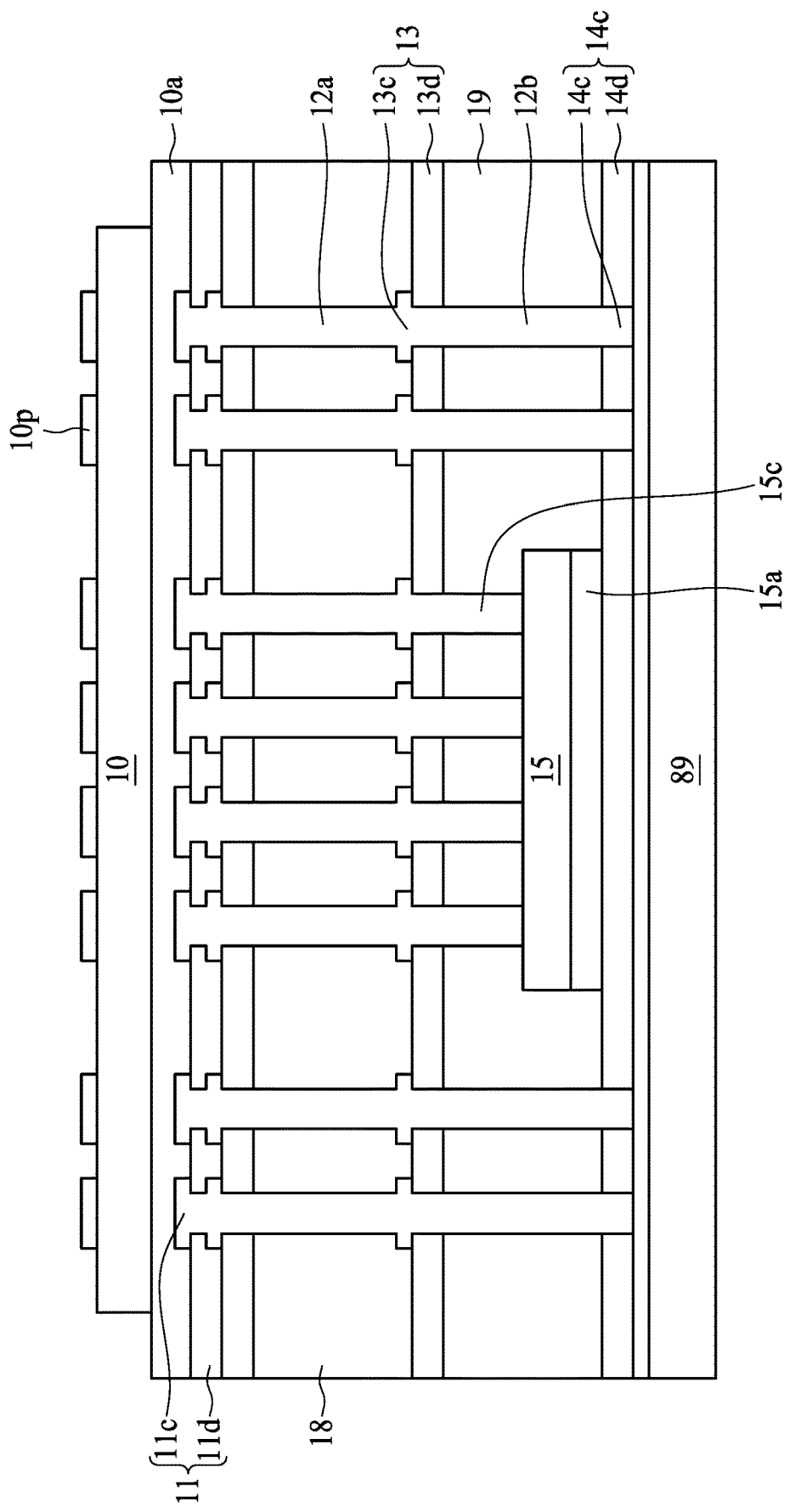
FIG. 9A, FIGS. 9B and 9C illustrate a semiconductor manufacturing method in accordance with some embodiments of the present disclosure.
Figure 9B:
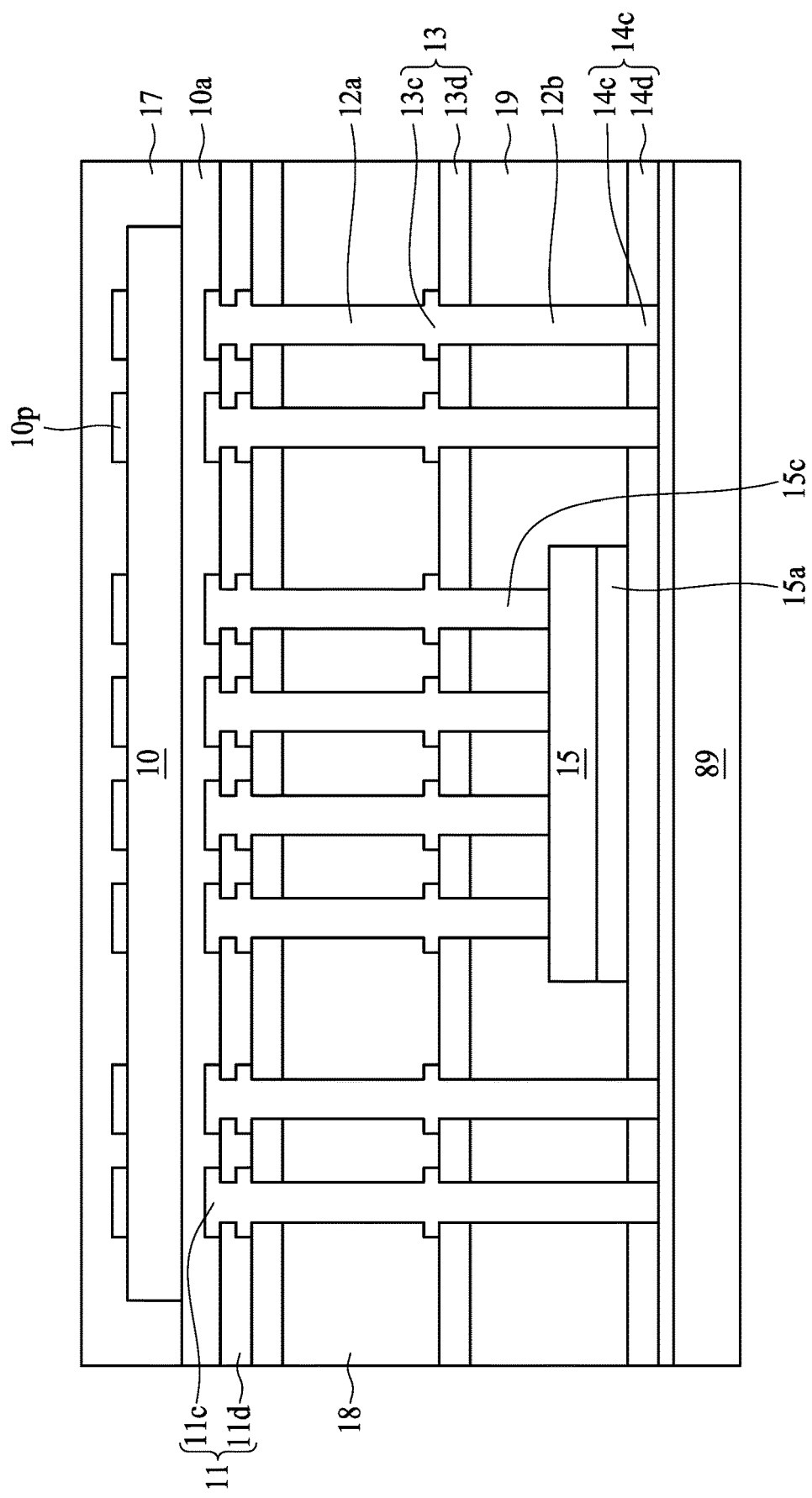
Figure 9C:
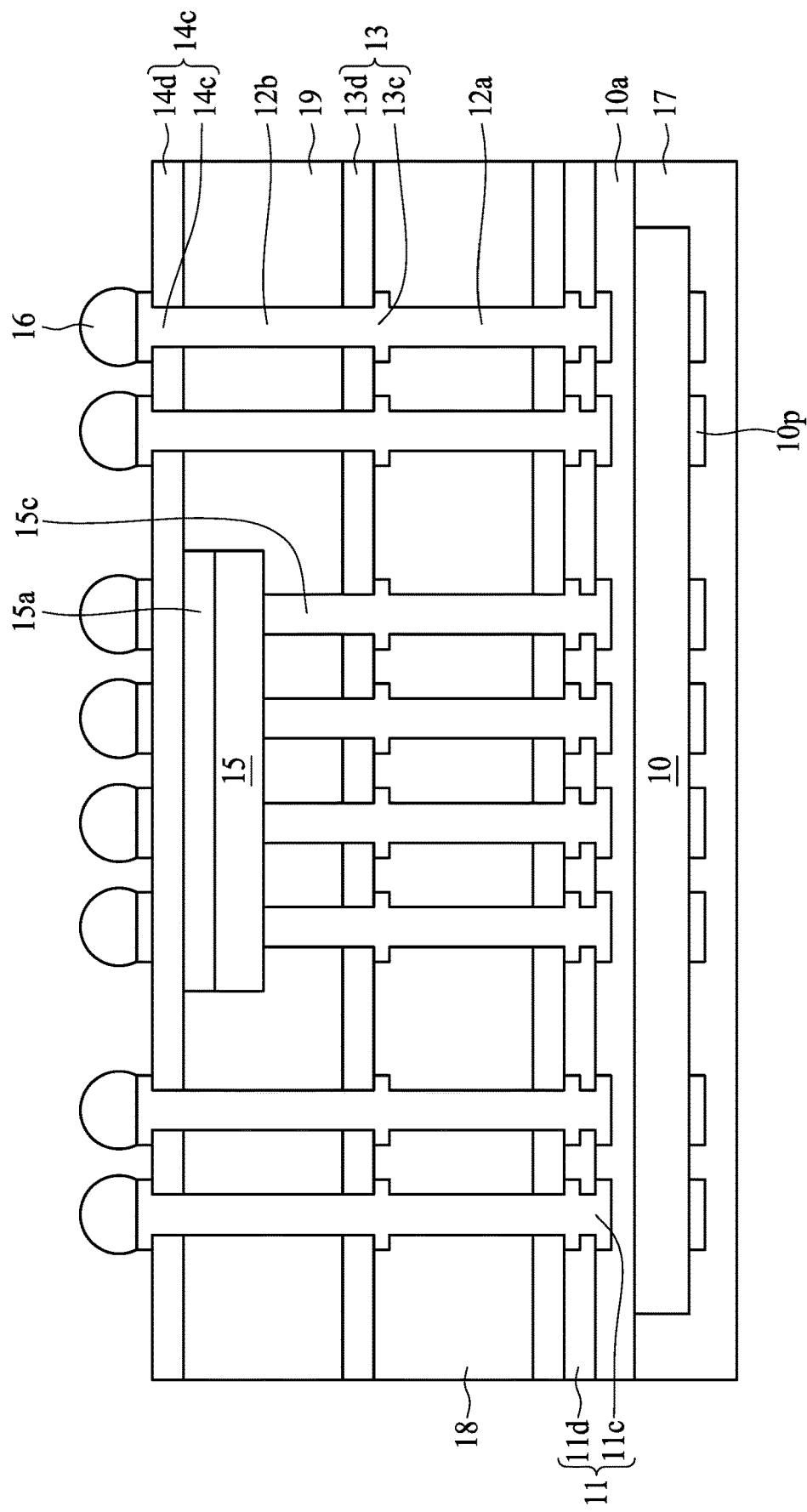

FIG. 9A, FIG. 9B and FIG. 9C illustrate a semiconductor manufacturing method in accordance with some embodiments of the present disclosure. In some embodiments, the method in FIG. 9A, FIG. 9B and FIG. 9C can be used to manufacture the semiconductor device package 2 in FIG. 2. The operation in FIG. 9A may be carried out after the operation in FIG. 8F. The operations in FIGS. 9A, 9B and 9C are similar to the operations in FIGS. 8G, 8H and 8I, and one of the differences therebetween is that in FIG. 9A, a width of the adhesive layer 10a is greater than a width of the carrier 10.

FIG. 10A, FIG. 10B, FIG. 10C, FIG. 10D, FIG. 10E, FIG. 10F, FIG. 10G and FIG. 10H illustrate a semiconductor manufacturing method in accordance with some embodiments of the present disclosure. In some embodiments, the method in FIG. 10A, FIG. 10B, FIG. 10C, FIG. 10D, FIG. 10E, FIG. 10F, FIG. 10G and FIG. 10H can be used to manufacture the semiconductor device package 7 in FIG. 7.

Figure 10A:
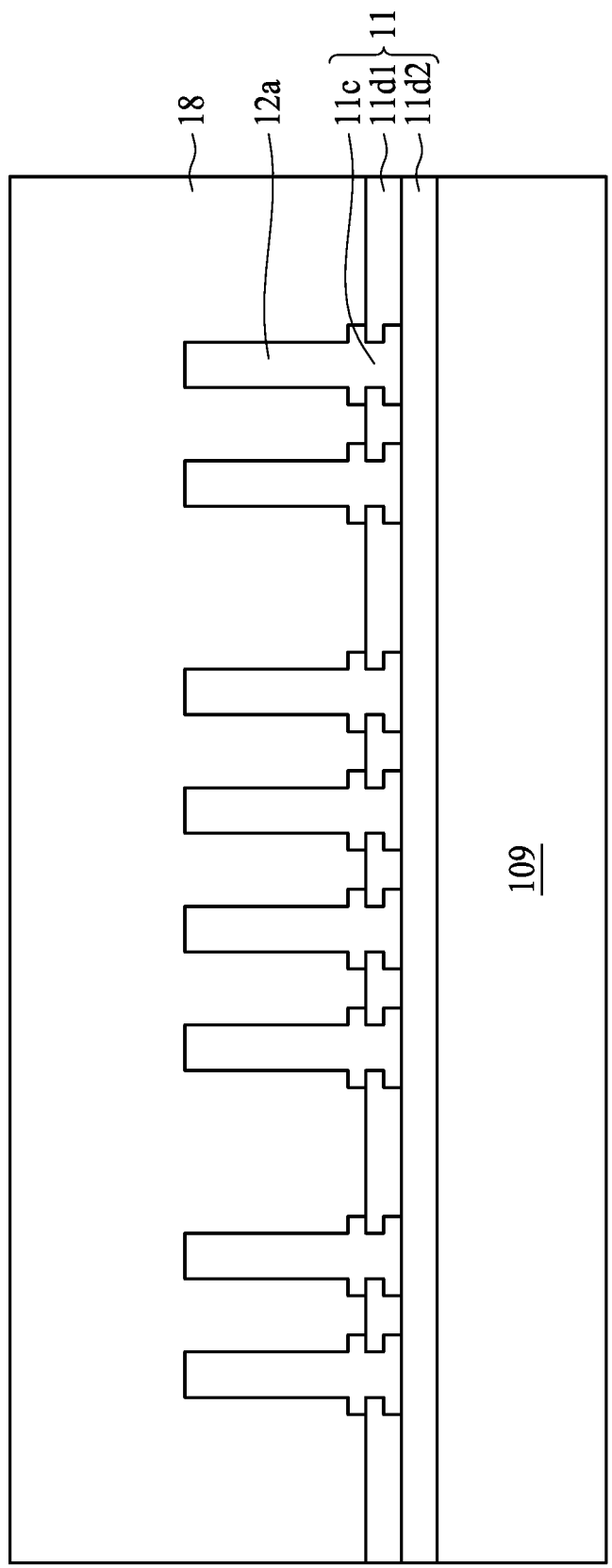
FIG. 10A, FIG. 10B, FIG. 10C, FIG. 10D, FIG. 10E, FIG. 10F, FIG. 10G and FIG. 10H illustrate a semiconductor manufacturing method in accordance with some embodiments of the present disclosure.

Referring to FIG. 10A, a carrier 109 is provided. A circuit layer 11 including a conductive layer 11c and dielectric layers 11d1, 11d2 is formed on the carrier 109. Interconnection structures 12a are then formed on the circuit layer 11 to be electrically connected to the circuit layer 11. The dielectric layers 11d1 and 11d2 are formed by, for example but is not limited to, photolithographic technique. In some embodiments, the interconnection structures 12a may be formed by, for example but is not limited to, plating technique. A package body 18 is then formed on the circuit layer 11 to cover the interconnection structures 12a. In some embodiments, the package body 18 is formed by, for example, by a transfer molding technique, a compression technique or any other suitable techniques.

Figure 10B:
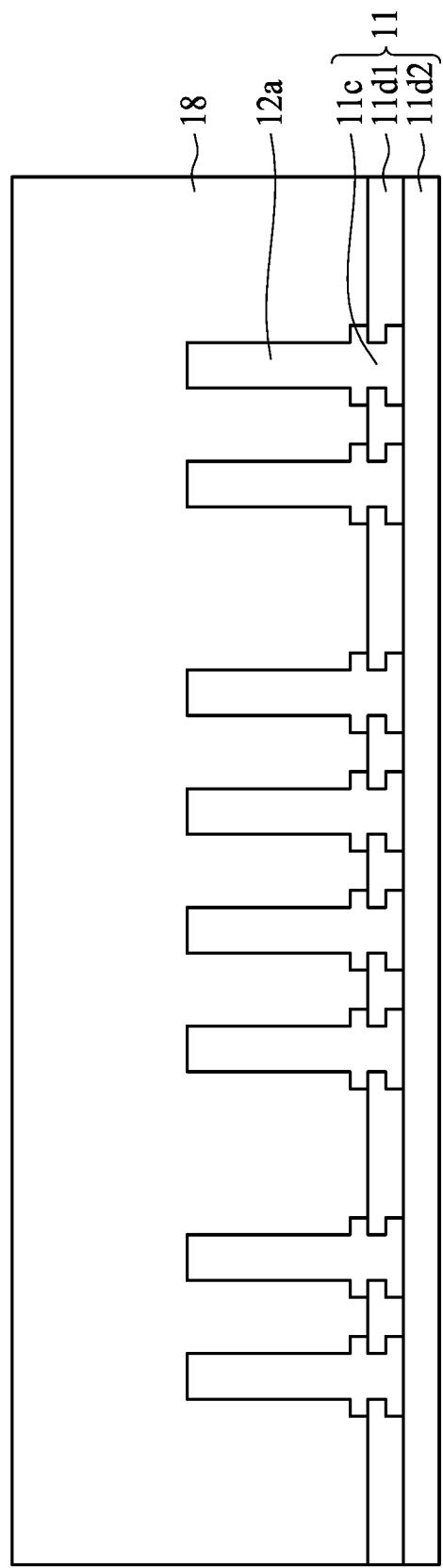
Figure 10C:
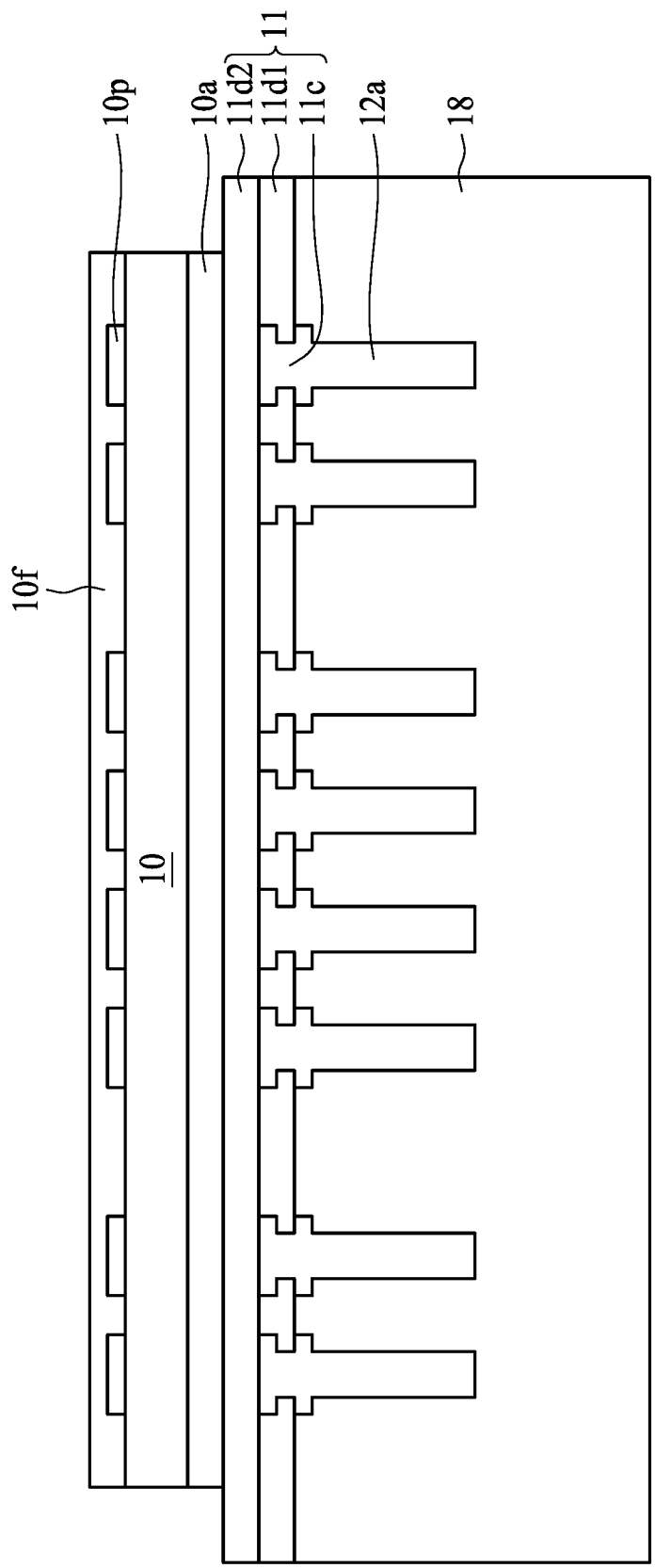

Referring to FIG. 10B, the carrier 109 is removed from the circuit layer 11 to expose the dielectric layer 11d2. A carrier 10 is disposed on the circuit layer 11 as shown in FIG. 10C. In some embodiments, the carrier 10 is attached to the circuit layer 11 through an adhesive layer 10a. The carrier 10 has a conductive layer 10p disposed thereon and a protection layer 10f covers the conductive layer 10p. In some embodiments, the carrier 10 may be formed by performing a singulation to divide a glass wafer into a plurality of glass carriers including the carrier 10.

Figure 10D:
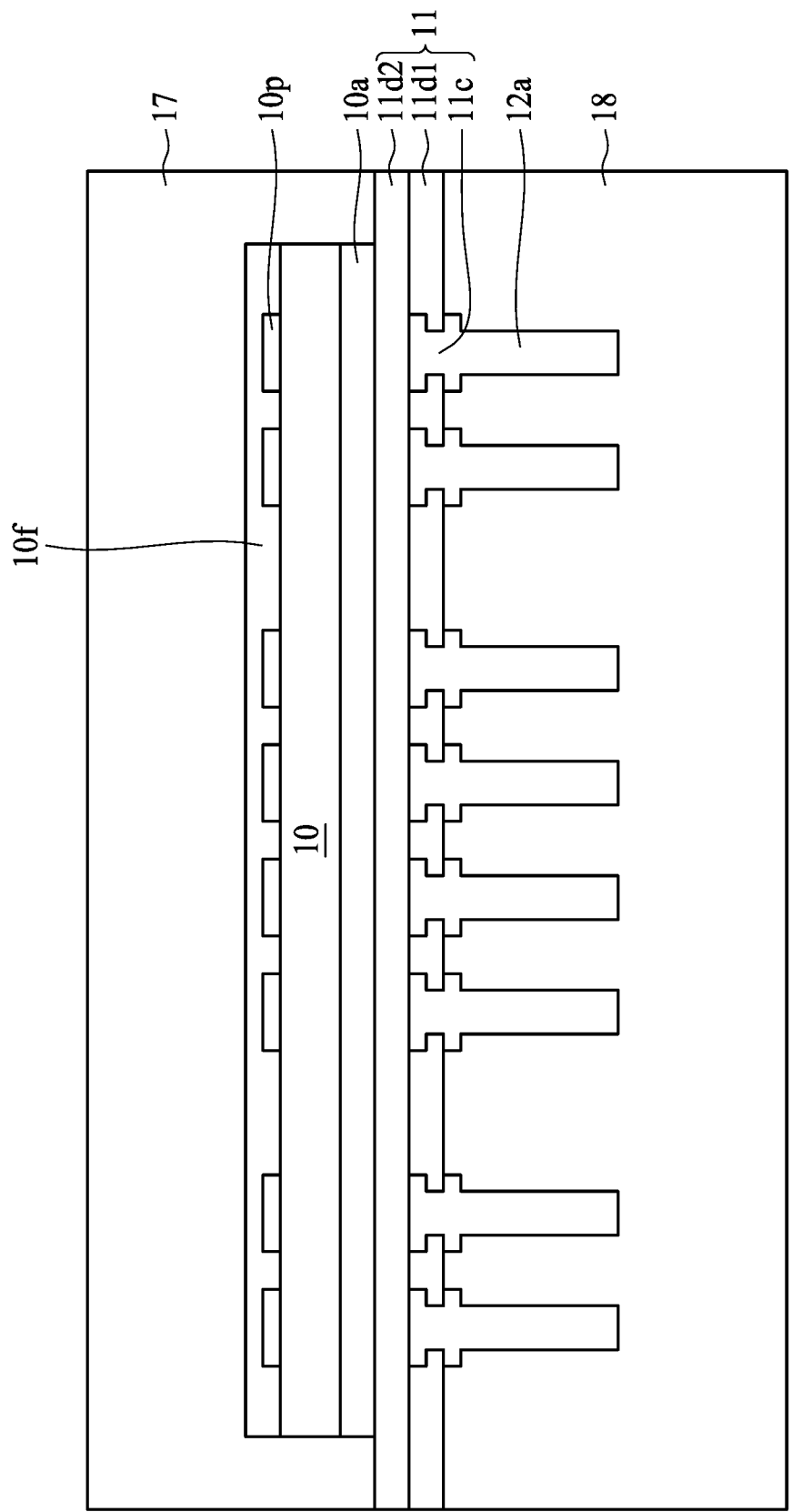

Referring to FIG. 10D, a package body 17 is formed on the circuit layer 11 to cover the carrier 10. In some embodiments, the package body 17 is formed by, for example, by a transfer molding technique, a compression technique or any other suitable techniques. In some embodiments, the package body 17 may be replaced by forming a protection layer 57 or 58 as shown in FIG. 5A, 5B, 5C or 5D.

Figure 10E:
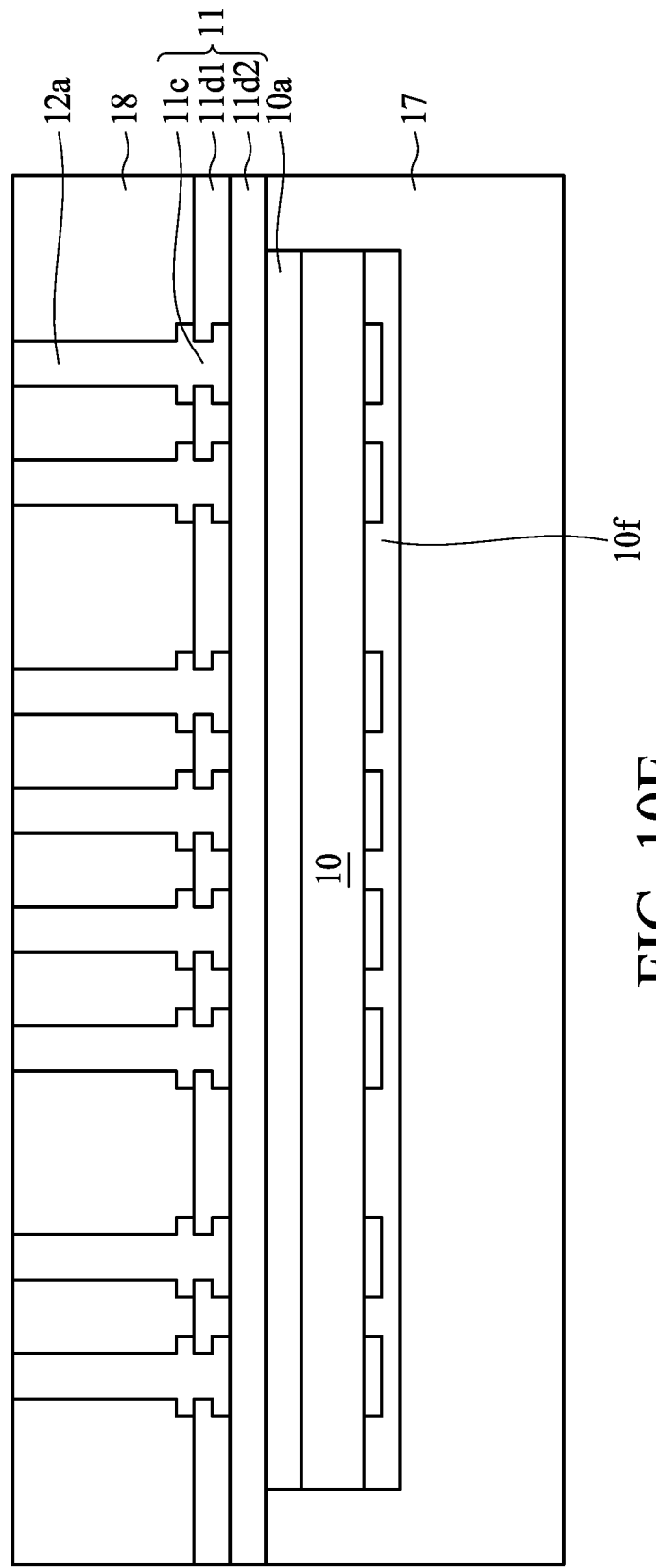

Referring to FIG. 10E, a portion of the package body 18 is removed by, for example, grinding or any other suitable techniques to expose a top portion of the interconnection structures 18 for electrical connections.

Figure 10F:
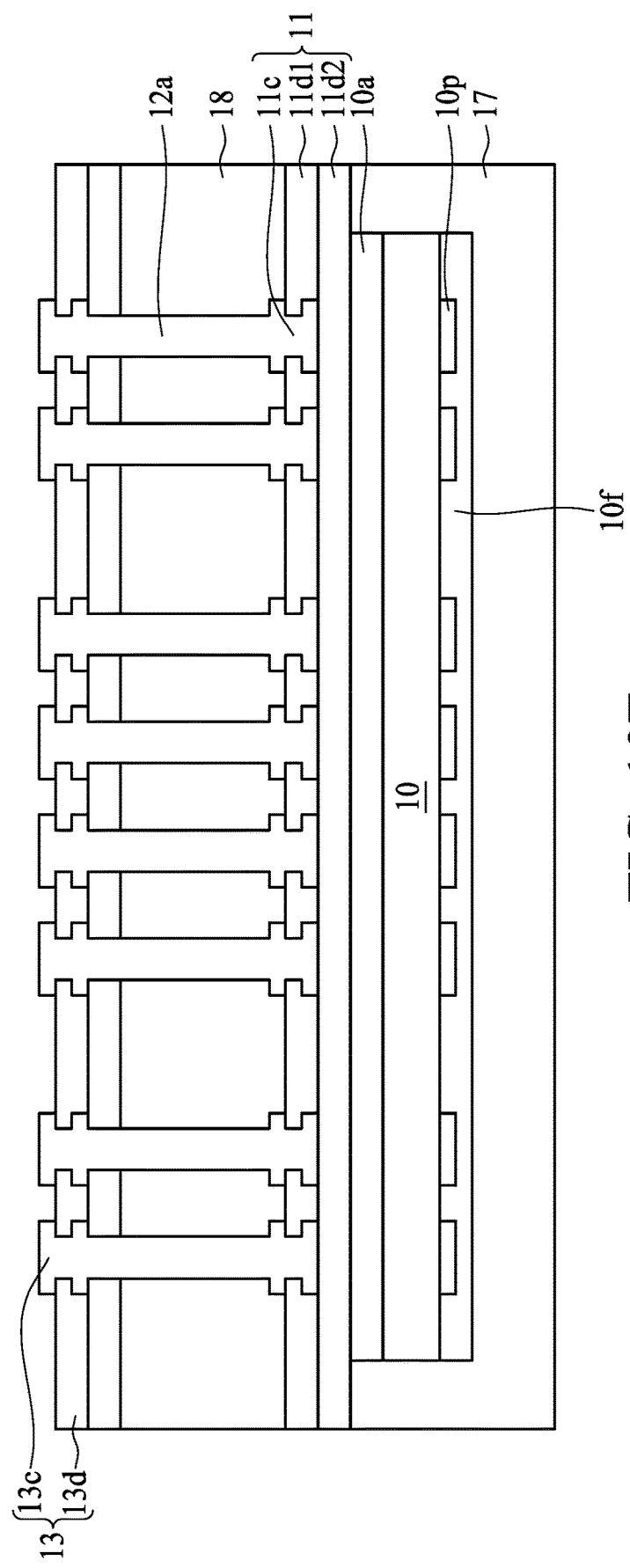

Referring to FIG. 10F, a circuit layer 13 including a conductive layer 13c and a dielectric layer 13d is formed on the package body 18 and electrically connected to the interconnection structures 12a exposed from the package body 18. The dielectric layer 13d is formed by, for example but is not limited to, photolithographic technique.

Figure 10G:
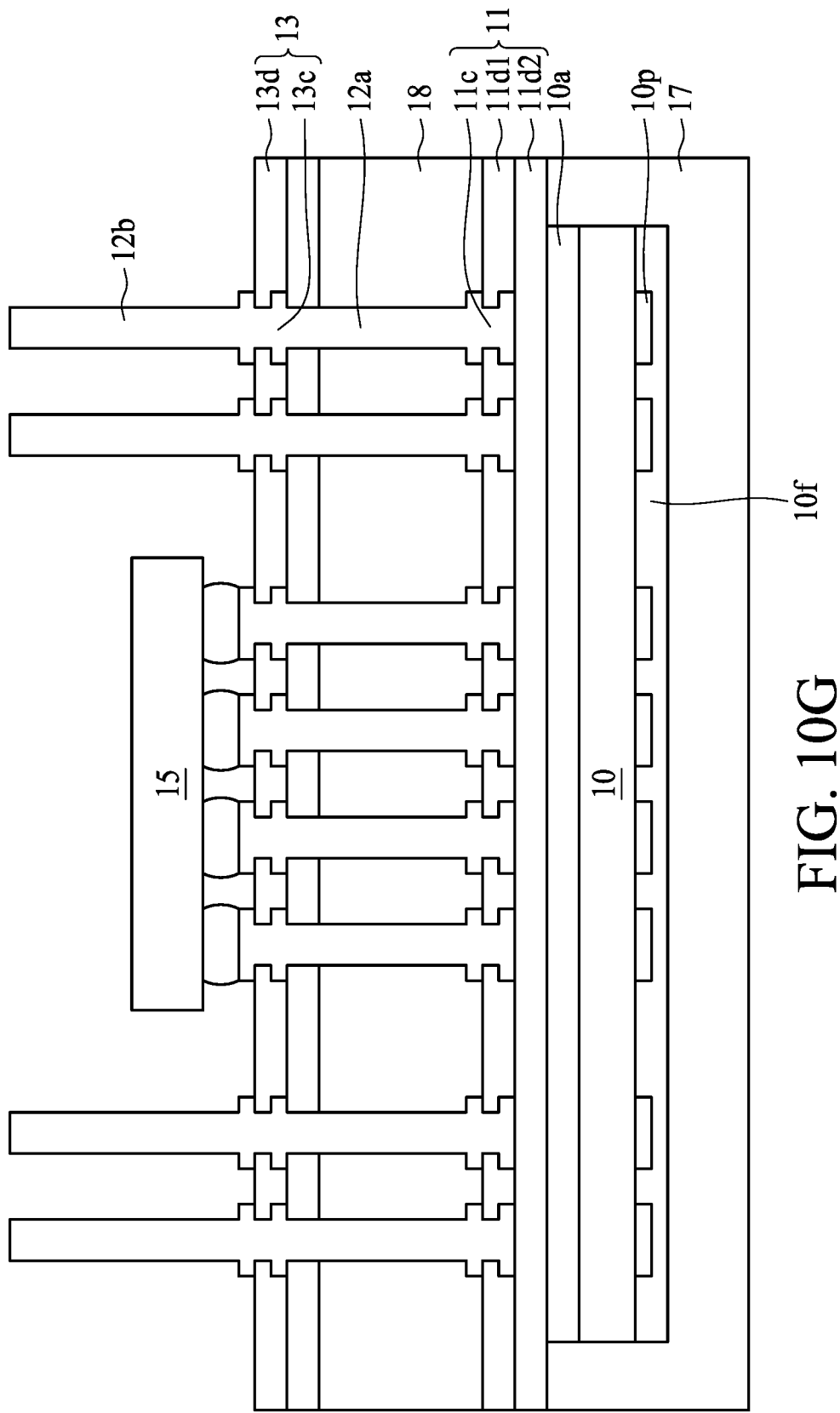

Referring to FIG. 10G, interconnection structures 12b are formed on the circuit layer 13 to be electrically connected to the circuit layer 13. In some embodiments, the interconnection structures 12b may be formed by, for example but is not limited to, plating technique. An electronic component 15 is then disposed on the circuit layer 13 by, for example, flip-chip or any other suitable techniques. In some embodiments, an active surface of the electronic component 15 is connected to the circuit layer 13 through electrical contacts (e.g., solder balls).

Figure 10H:
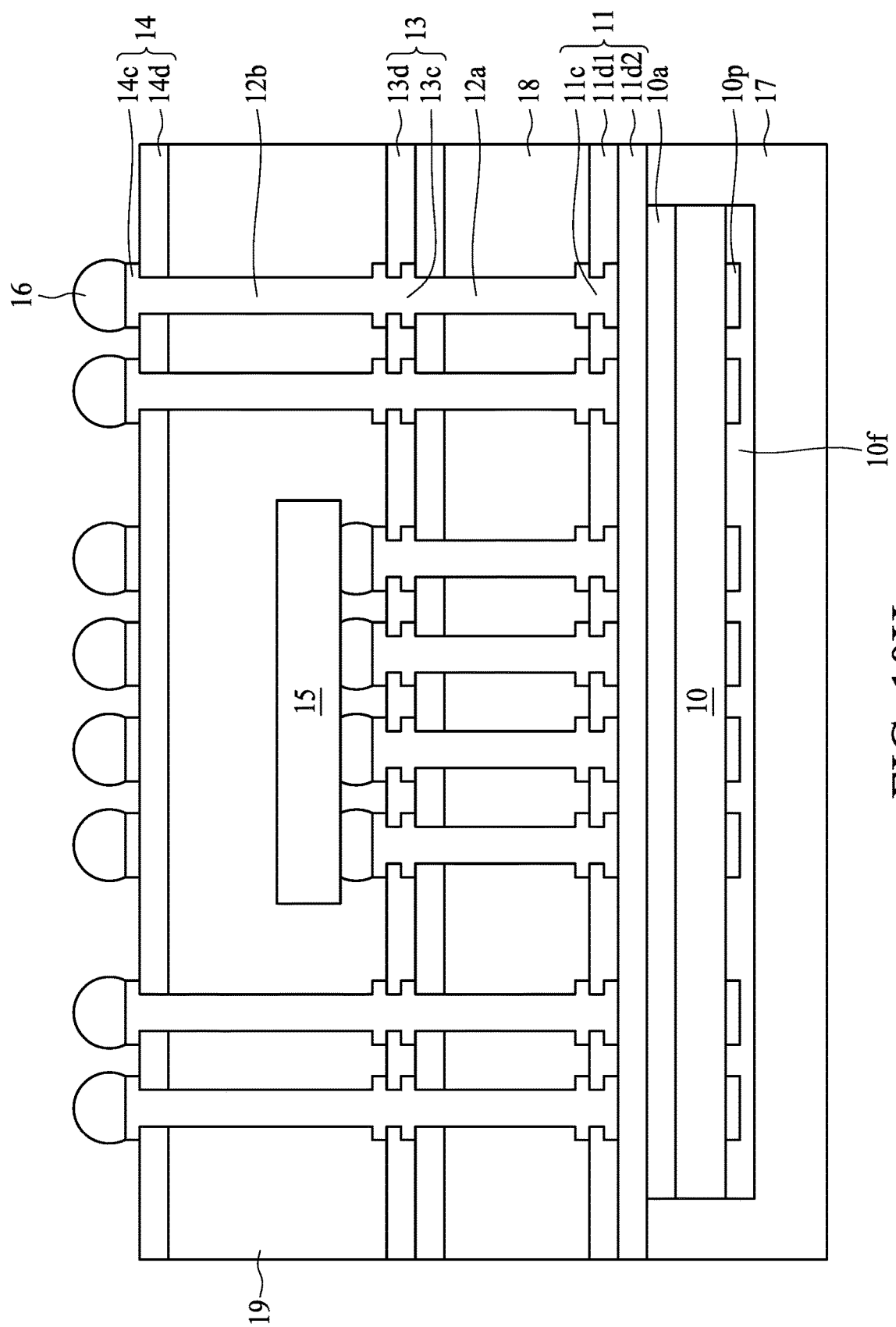

Referring to FIG. 10H, a package body 19 is formed on the circuit layer 13 to cover the interconnection structures 12b and the electronic component 15. A top portion of the interconnection structures 12b are exposed from the package body 19 for electrical connections. In some embodiments, the package body 19 is formed by, for example, by a transfer molding technique, a compression technique or any other suitable techniques. A circuit layer 14 including a conductive layer 14c and a dielectric layer 14d is formed on the package body 19 and electrically connected to the interconnection structures 12b exposed from the package body 19. The dielectric layer 14d is formed by, for example but is not limited to, photolithographic technique. Electrical contacts 16 are then disposed on the conductive layer 14c exposed from the dielectric layer 14d.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
a first circuit having a lateral surface;
an emitting device disposed on the first circuit and having a lateral surface recessed with respect to the lateral surface of the first circuit, wherein the emitting device includes a first antenna configured to electrically connect to the first circuit;
a first molding compound encapsulating the first antenna and the lateral surface of the emitting device;
a sub-package including a second circuit, an electronic component disposed on the second circuit, and a second molding compound encapsulating the electronic component; and
an underfill disposed between the sub-package and the first circuit and connecting the sub-package with the first circuit,
wherein a lateral surface of the second molding compound, a lateral surface of the underfill, and a lateral surface of the first molding compound are substantially aligned.

2. The semiconductor device package of claim 1, further comprising:
a first electrical contact disposed on a first surface of the sub-package and electrically connecting the sub-package to the first circuit; and
a second electrical contact disposed on a second surface of the sub-package opposite to the first surface, wherein the first electrical contact is covered by the underfill and connects to the first circuit.

3. The semiconductor device package of claim 1, further comprising an adhesive layer in contact with the emitting device and the first circuit, wherein the first circuit includes a second antenna embedded in the adhesive layer.

4. The semiconductor device package of claim 1, wherein the first antenna includes a plurality of first patterns located in a first region and a plurality of second patterns located in a second region, wherein a distance between two most adjacent ones of the first patterns or between two most adjacent ones of the second patterns is less than a distance between the first region and the second region, and wherein a projection of an electronic component on the emitting device overlaps with the first region.

5. The semiconductor device package of claim 1, wherein the first molding compound has a first lateral surface coplanar with the lateral surface of the first circuit and a second lateral surface recessed from the first lateral surface.

6. A semiconductor device package, comprising:
a first circuit layer having a plurality of first antenna patterns;
a divided carrier connected to the first antenna patterns through an adhesive layer;
a plurality of second antenna patterns disposed over the adhesive layer, and separated from the first antenna patterns by the divided carrier;
a protection layer encapsulating the second antenna patterns and opposite to the adhesive layer with respect to the divided carrier, wherein a lateral surface of the protection layer, a lateral surface of the divided carrier, and a lateral surface of the adhesive layer are substantially aligned, and wherein the lateral surface of the protection layer, the lateral surface of the divided carrier, and the lateral surface of the adhesive layer are misaligned with a lateral surface of the first circuit layer; and a molding compound covering the lateral surface of the protection layer, the lateral surface of the divided carrier, and the lateral surface of the adhesive layer, wherein an amount of the first antenna patterns is identical to an amount of the second antenna patterns.

7. The semiconductor device package of claim 6, wherein a lateral surface of the molding compound is aligned with the lateral surface of the first circuit layer.

8. The semiconductor device package of claim 6, wherein each of the first antenna patterns overlaps a corresponding one of second antenna patterns in a cross-sectional view.

9. The semiconductor device package of claim 6, wherein a lateral surface of each of the first antenna patterns is substantially aligned with a lateral surface of a corresponding one of the second antenna patterns in a cross-sectional view.

10. The semiconductor device package of claim 6, wherein the first circuit layer includes a plurality of pillars under a lower surface of the first circuit layer, and wherein an amount of the pillars is identical to the amount of the second antenna patterns.

11. The semiconductor device package of claim 10, wherein each of the pillars overlaps with a corresponding one of the second antenna patterns.

\* \* \* \* \*